United States Patent
Uchida

(10) Patent No.: US 9,848,150 B2
(45) Date of Patent: Dec. 19, 2017

(54) IMAGE PICKUP APPARATUS COMPRISING A/D CONVERTER WITH OFFSET AND GAIN CORRECTION BASED ON AMPLITUDE OF INPUT SIGNAL

(71) Applicant: CANON KABUSHIKI KAISHA, Tokyo (JP)

(72) Inventor: Mineo Uchida, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 251 days.

(21) Appl. No.: 14/262,212

(22) Filed: Apr. 25, 2014

(65) Prior Publication Data
US 2014/0333816 A1 Nov. 13, 2014

(30) Foreign Application Priority Data
May 8, 2013 (JP) ................................ 2013-098892

(51) Int. Cl.
*H04N 5/3745* (2011.01)
*H04N 5/378* (2011.01)
(Continued)

(52) U.S. Cl.
CPC ...... *H04N 5/37455* (2013.01); *H03M 1/0609* (2013.01); *H03M 1/1019* (2013.01); *H03M 1/1028* (2013.01); *H04N 5/378* (2013.01)

(58) Field of Classification Search
USPC .................................................. 341/118–121
See application file for complete search history.

(56) References Cited

U.S. PATENT DOCUMENTS 6,353,401 B1 * 3/2002 Aswell ................ H03M 1/1028
341/118
7,148,832 B2 * 12/2006 Wada .................... H03M 1/181
341/120
(Continued)

FOREIGN PATENT DOCUMENTS

JP 05-048460 A 2/1993
JP 2010-045789 A 2/2010
(Continued)

OTHER PUBLICATIONS

The above foreign patent documents were cited in the Feb. 13, 2017 Japanese Office Action, which is enclosed without an English Translation, that issued in Japanese Patent Application No. 2013098892.

*Primary Examiner* — Twyler Haskins
*Assistant Examiner* — Akshay Trehan
(74) *Attorney, Agent, or Firm* — Cowan, Liebowitz & Latman, P.C.

(57) ABSTRACT

An image pickup apparatus comprising a pixel configured to convert optical signal into an electrical signal, a comparison unit configured to compare a pixel signal from the pixel with a reference voltage, an A/D conversion unit configured to analog/digital (A/D)-convert the pixel signal in a conversion mode selected based on a comparison result of the comparison unit, and a correction unit configured to correct at least one of an offset and a gain generated by the A/D conversion for an output data of the A/D conversion unit, wherein a value for offset correction or gain correction performed by the correction unit is changed according to the selected conversion mode.

14 Claims, 22 Drawing Sheets

(51) Int. Cl.
  *H03M 1/06*  (2006.01)
  *H03M 1/10*  (2006.01)

(56) References Cited

U.S. PATENT DOCUMENTS

| | | | |
|---|---|---|---|
| 7,671,317 B2* | 3/2010 | Shimomura | H04N 5/3742 250/208.1 |
| 2004/0051790 A1* | 3/2004 | Tamaru | H04N 5/202 348/223.1 |
| 2004/0075748 A1* | 4/2004 | Andrew Rogers | H04N 1/48 348/222.1 |
| 2007/0080838 A1* | 4/2007 | Asayama | H03M 1/0863 341/144 |
| 2009/0040352 A1* | 2/2009 | Kawaguchi | G06F 3/044 348/308 |
| 2009/0109315 A1* | 4/2009 | Taura | H04N 5/378 348/311 |
| 2009/0159782 A1* | 6/2009 | Murakami | H03M 1/1023 250/208.1 |
| 2009/0225211 A1* | 9/2009 | Oike | H03M 1/1023 348/308 |
| 2009/0231479 A1* | 9/2009 | Zarnowski | H03M 1/123 348/302 |
| 2009/0273695 A1* | 11/2009 | Mabuchi | H03M 1/186 348/300 |
| 2010/0309356 A1* | 12/2010 | Ihara | H04N 5/3658 348/300 |
| 2011/0267211 A1* | 11/2011 | Oshima | H03M 1/1038 341/118 |
| 2012/0146820 A1* | 6/2012 | Nam | H03M 1/069 341/110 |
| 2012/0262614 A1* | 10/2012 | Deng | H03M 1/0641 348/302 |
| 2015/0215553 A1* | 7/2015 | Medeiro Hidalgo | H03M 3/46 250/208.1 |

FOREIGN PATENT DOCUMENTS

| | | |
|---|---|---|
| JP | 2010-074331 A | 4/2010 |
| JP | 2011-250039 A | 12/2011 |
| JP | 2012-015599 A | 1/2012 |
| JP | 2012-080195 A | 4/2012 |
| JP | 2013-058930 A | 3/2013 |

* cited by examiner (PRIOR ART)

ical signal into an electrical signal, a comparison unit configured to compare a pixel signal from the pixel with a reference voltage, an A/D conversion unit configured to analog/digital (A/D)-convert the pixel signal in a conversion mode selected based on a comparison result of the comparison unit, and a correction unit configured to correct at least one of an offset and a gain generated by the A/D conversion for an output data of the A/D conversion unit, wherein a value for offset correction or gain correction performed by the correction unit is changed according to the selected conversion mode.

IMAGE PICKUP APPARATUS COMPRISING A/D CONVERTER WITH OFFSET AND GAIN CORRECTION BASED ON AMPLITUDE OF INPUT SIGNAL

BACKGROUND OF THE INVENTION

Field of the Invention

The present invention relates to an image pickup apparatus and, more particularly, to an image pickup apparatus including, in an image sensor, an A/D converter for converting an analog signal obtained by photoelectric conversion into a digital signal.

Description of the Related Art

Recent image pickup apparatuses such as a digital camera and digital video camera require a technique of reading out image signals from an image sensor at high speed to increase the number of pixels and improve the continuous shooting speed. When performing, for each pixel, analog/digital conversion (A/D conversion) for a signal read out at high speed, the conversion time for each pixel data is very short. It is, therefore, necessary to perform conversion with high accuracy within a short time.

To solve this problem, research and development have been carried out for a column A/D conversion image sensor in which A/D convertors are arranged for each column of pixels of a CMOS image sensor which can be manufactured by the same process as that of a CMOS integrated circuit to simultaneously A/D-convert pixel signals on one row. In the column A/D conversion image sensor, the conversion rate of the A/D convertor can be lowered from a readout rate for each pixel to that for each row, thus readily speeding up the readout rate of one frame of the image sensor.

Some column A/D conversion image sensors adopt a ramp A/D conversion method of causing a comparator to compare a ramp signal with a pixel signal, and measuring the time until the output of the comparator is inverted, as described in Japanese Patent Laid-Open No. 05-048460. This ramp A/D conversion method, however, needs to count clocks by the number of conversion bits. Therefore, a large number of bits significantly prolongs the A/D conversion time. For example, the A/D conversion time for (N+2) bits is four times that for N bits.

As a method of solving this problem, a method of changing the relative relationship between a signal amplitude and a ramp signal amplitude in accordance with a signal amplitude and performing A/D conversion is plausible, as disclosed in Japanese Patent Laid-Open No. 2010-45789.

In Japanese Patent Laid-Open No. 2010-45789, in N-bit A/D conversion, the value of an analog signal is compared with a threshold obtained by dividing the full-scale amplitude by $2^K$ (K is an integer smaller than N). The signal is A/D-converted into (N−K) bits. If the value of the signal is larger than the threshold, the result of the A/D conversion is set at (N−K) bits on the MSB side of N-bit digital data. Alternatively, if the value of the signal is equal to or smaller than the threshold, the result is set at (N−K) bits on the LSB side of N-bit digital data. This increases the number of bits of A/D converter while suppressing an increase in A/D conversion time. Furthermore, Japanese Patent Laid-Open No. 2010-45789 discloses the following arrangement. That is, two ramp signals having different slopes are generated, and if the signal value is larger than the threshold, a ramp signal having a larger slope is used to perform conversion; otherwise, a ramp signal having a smaller slope is used to perform conversion.

As described in Japanese Patent Laid-Open No. 2010-45789, however, when the relative magnitudes of the signal and the ramp signal are changed based on the result of comparing the signal value with the threshold, the characteristics (input/output characteristics) of final output data with respect to the analog input signal may shift at the threshold. FIG. 22 schematically shows an example of the input/output characteristics. Let Vm be a threshold for switching an A/D conversion method by comparison with the value of a signal. A dotted line indicates ideal input/output characteristics, and thick solid lines indicate actual input/output characteristics. It is desirable that the actual input/output characteristics coincide with the ideal input/output characteristics. When switching between the ramp signals in accordance with the magnitude relationship between the threshold and the signal value as described in Japanese Patent Laid-Open No. 2010-45789, the slopes of the two ramp signals and the occurrence of an offset may cause a shift in the input/output characteristics at the threshold Vm as a boundary, as shown in FIG. 22.

SUMMARY OF THE INVENTION

In view of this, the present invention, an image pickup apparatus capable of performing multi-bit A/D conversion at high speed by selecting an A/D conversion mode attains good image quality by correcting a shift in the input/output characteristics of the A/D conversion mode to be closer to the ideal input/output characteristics.

The present invention provides an image pickup apparatus comprising a pixel configured to convert opt- Further features of the present invention will become apparent from the following description of exemplary embodiments (with reference to the attached drawings).

DESCRIPTION OF THE EMBODIMENTS

Exemplary embodiments of the present invention will be described below with reference to the accompanying drawings.

First Embodiment

Figure 1:
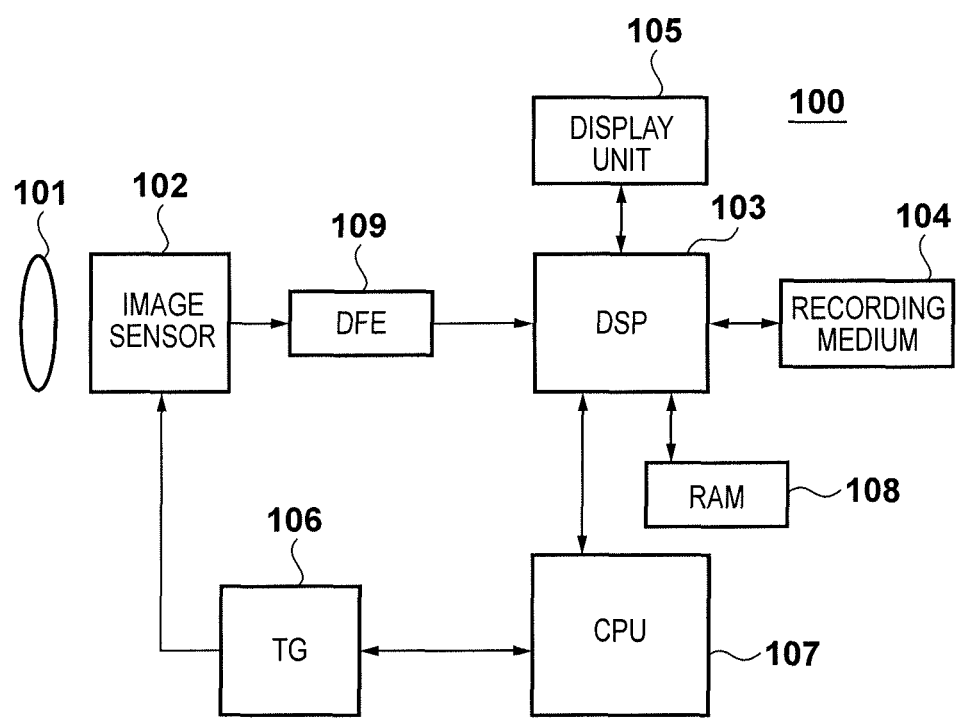
FIG. 1 is a block diagram showing the overall arrangement of an image pickup apparatus according to an embodiment of the present invention.

The overall arrangement of an image pickup apparatus 100 according to the embodiment will be explained with reference to FIG. 1. An imaging lens 101 causes light from an object to form an image on an image sensor 102. The image sensor 102 is used to convert the optical signal of the formed object image into an electrical signal. A CMOS image sensor or the like is used as the image sensor 102. In the image sensor 102, an A/D conversion unit for converting an analog signal (electrical signal) into a digital signal is also arranged.

A DFE (Digital Front End) 109 performs correction processing for a digital image signal output from the image sensor 102. A DSP (Digital Signal Processor) 103 performs various kinds of image processing and compression/decompression processing for the digital image signal output from the DFE 109. Note that although the correction processing performed by the DFE 109 can also be performed in the DSP 103 or image sensor 102, the DFE 109 performs the correction processing in this example for the sake of descriptive convenience. Image data processed by the DSP 103 is recorded in a recording medium 104. A display unit 105 is used to display shot images and various menu screens. A liquid crystal display (LCD) or the like is used as the display unit 105. A timing generator (TG) 106 supplies a driving signal to the image sensor 102 and the like. A CPU 107 controls the DSP 103 and the TG 106. A RAM 108 is a memory for temporarily storing image data and the like, and is connected to the DSP 103.

Figure 2:
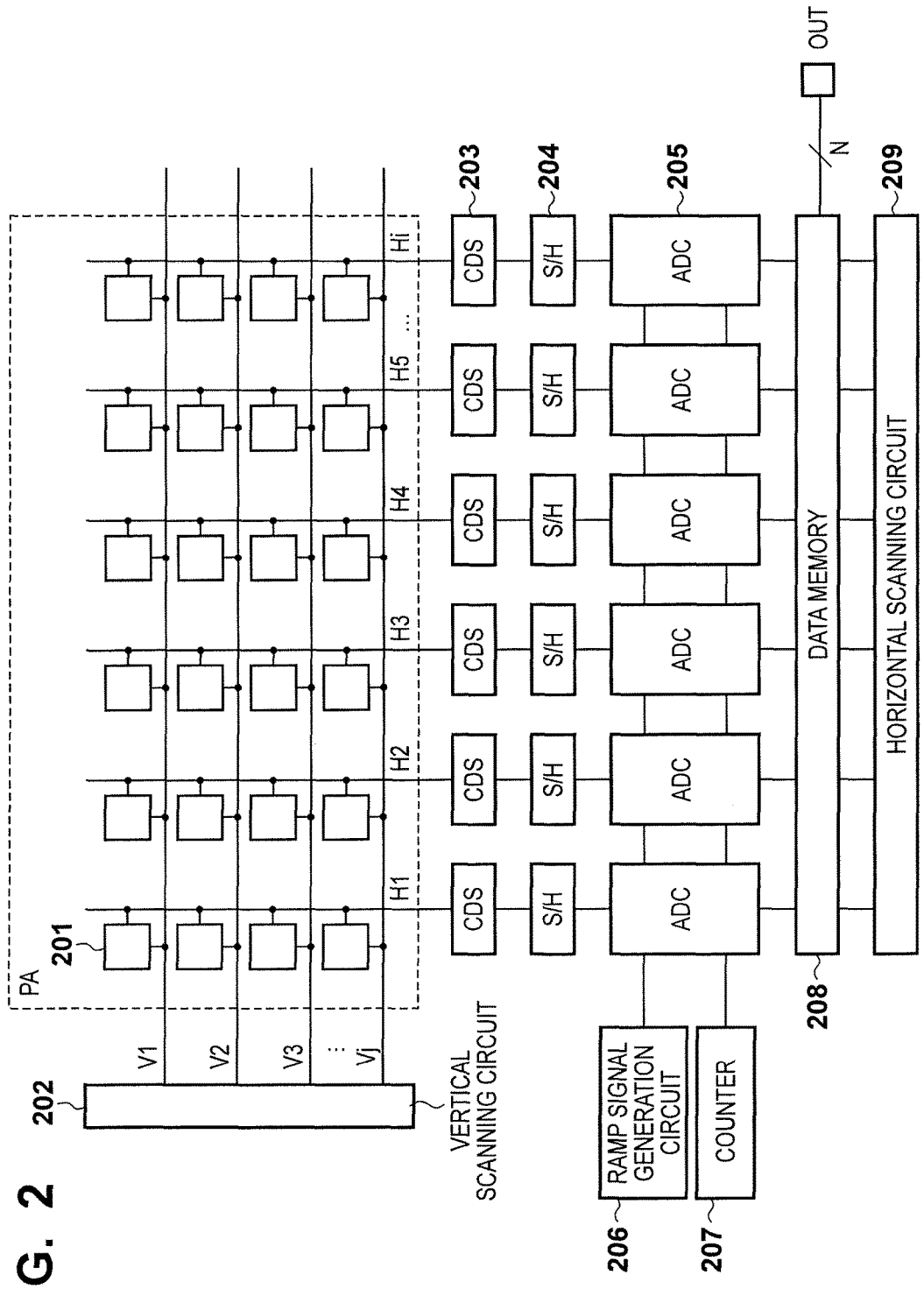
FIG. 2 is a block diagram showing the overall arrangement of an image sensor according to the embodiment of the present invention.

FIG. 2 is a block diagram showing the overall arrangement of the image sensor 102. In a pixel area PA, i×j pixels 201 are arranged in the row and column directions. The pixel 201 photo-electrically converts the incident optical signal of an object. The signals photo-electrically converted in the respective pixels are transferred to vertical output lines H1 to Hi for each row by driving signals supplied by a vertical scanning circuit 202 through driving lines V1 to Vj.

A CDS amplifier 203 arranged for each column performs CDS (Correlation Double Sampling) processing for the photo-electrically converted signals, and amplifies the resultant signals. The pixel signals read out from the pixels 201 to the vertical output line are input to the CDS amplifier 203 on each column, and the CDS amplifier 203 removes pixel noise and amplifies the signals with a predetermined gain. The output of the CDS amplifier 203 is sampled and held by a corresponding sample and hold circuit 204 for each column. Each pixel signal sampled and held by the sample and hold circuit 204 is transferred to an A/D converter (ADC) 205 arranged for each column, and is converted into digital pixel data by the ADC 205. A ramp signal generation circuit 206 equally supplies, to the ADC 205 on each column, a ramp signal to be used for comparison with the pixel signal. The output of a counter 207 is also connected to the ADC 205 on each column. The conversion result of each ADC 205 is stored in a data memory 208. After that, a horizontal scanning circuit 209 selects/transfers the results for each column, and outputs them from the image sensor 102.

Figure 3:
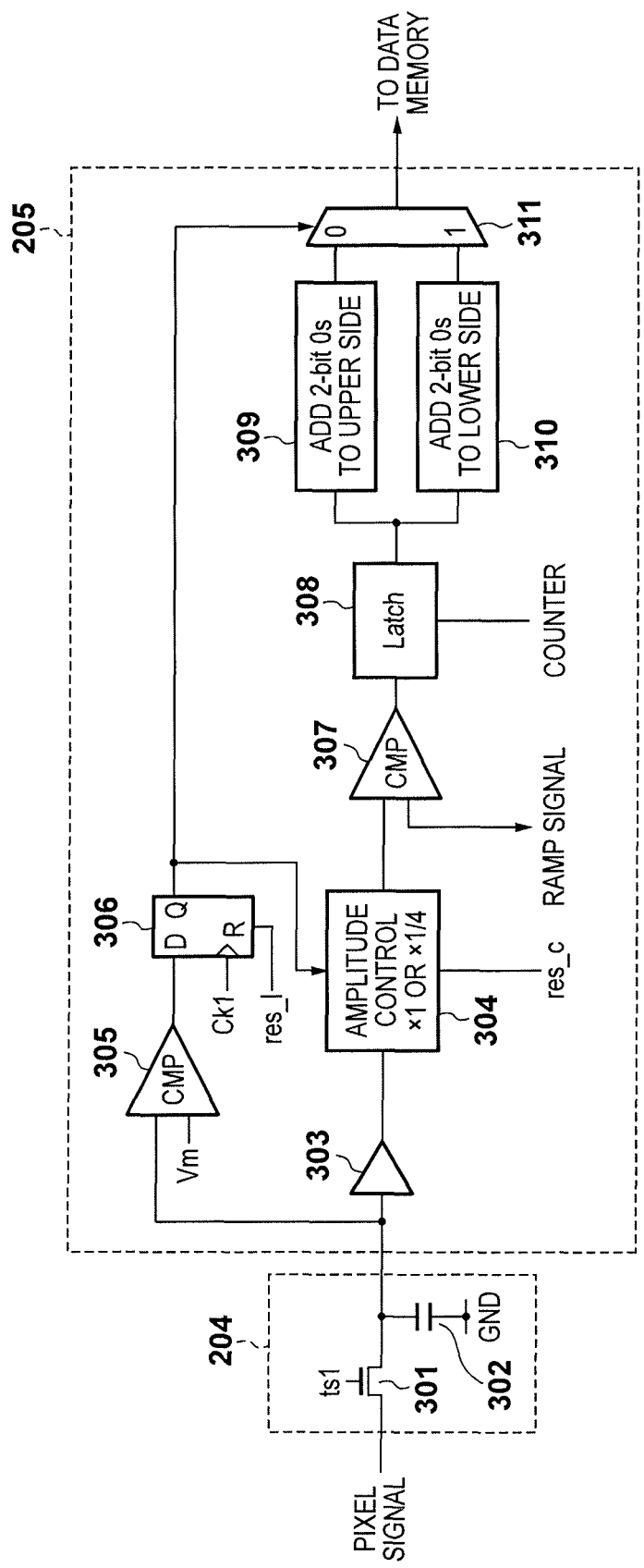
FIG. 3 is a circuit diagram showing the arrangement of a sample and hold circuit and an A/D conversion circuit according to the embodiment of the present invention.

An example of the arrangement of the sample and hold circuit 204 and the N-bit ADC 205 on each column will be described next with reference to FIG. 3. In this example, the time required for A/D conversion is prevented from being prolonged by classifying the pixel signal into that having a low luminance lower than a threshold (reference voltage) Vm and that having a high luminance equal to or higher than the threshold (reference voltage) Vm, thereby performing A/D conversion.

The sample and hold circuit 204 is formed by a first signal transfer switch 301 and a first capacitor 302. The pixel signal input to the sample and hold circuit 204 is held by the first capacitor 302 via the first signal transfer switch 301. The first capacitor 302 is connected to a signal amplitude control unit 304 via a buffer 303, and also connected to a first comparator 305. The first comparator 305 compares the signal of the first capacitor 302 with the reference voltage Vm, and the comparison result is transmitted to the signal amplitude control unit 304 via a flip-flop (FF) 306. The FF 306 has a data input terminal connected to the output of the first comparator 305, loads and holds data at the leading edge of a signal ck1, and is reset by a signal res_1. Assume that the reference voltage Vm is a voltage corresponding to ¼ of the full-scale amplitude of AD conversion in this embodiment.

The signal amplitude control unit 304 controls the amplitude of the pixel signal based on the comparison result input from the FF 306. More specifically, if the pixel signal has a voltage lower than the reference voltage Vm, the amplitude of the pixel signal is output intact (×1). On the other hand, if the pixel signal has a voltage equal to or higher than the reference voltage Vm, the amplitude of the pixel signal is multiplied by ¼ and output. The output of the signal amplitude control unit 304 is connected to the input terminal of a second comparator 307.

Figure 4:
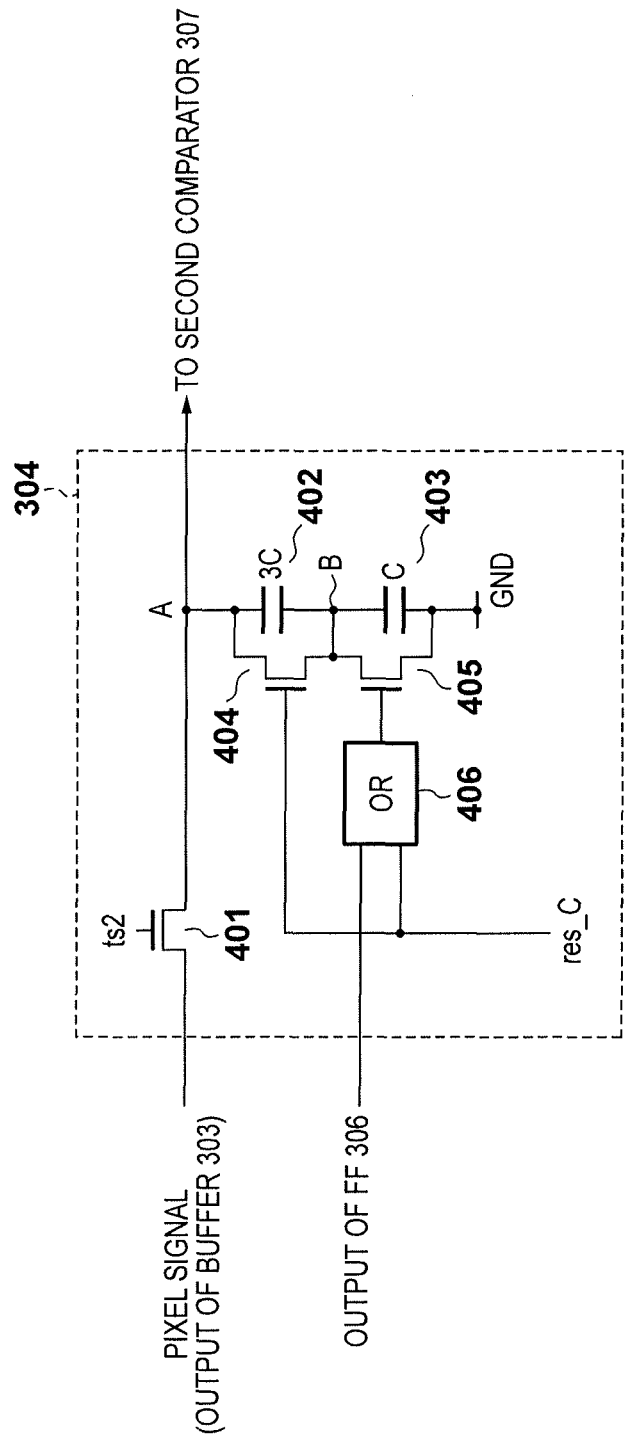
FIG. 4 is a circuit diagram showing an example of the arrangement of a signal amplitude control unit according to the embodiment of the present invention.

The signal amplitude control unit 304 will be described with reference to an example shown in FIG. 4. The pixel signal input from the buffer 303 to the signal amplitude control unit 304 is stored in a second capacitor 402 and a third capacitor 403 via a second signal transfer switch 401. The second capacitor 402 and the third capacitor 403 are series-connected. A first short-circuiting switch 404 and second short-circuiting switch 405 which short-circuit the two terminals of each of the second capacitor 402 and third capacitor 403 are respectively connected to them.

If the pixel signal has a voltage equal to or higher than the reference voltage Vm, the output of the first comparator 305 is set at high level, and the output of the FF 306 is also set at high level at the timing of the signal ck1. Therefore, the second short-circuiting switch 405 is short-circuited via an OR gate 406. This short-circuiting operation changes the capacitance, resulting in a change in amplitude of the pixel signal. In this example, since the capacitance value of the second capacitor 402 is set three times that of the third capacitor 403, a potential at a point A when the second short-circuiting switch 405 is short-circuited is ¼ of the original potential of the pixel signal.

Referring back to FIG. 3, the second comparator 307 compares the level of the pixel signal after controlling the amplitude with that of the ramp signal. The output of the second comparator 307 is input to a latch circuit 308. The latch circuit 308 also receives count data from the counter 207. When the level of the ramp signal exceeds that of the pixel signal and the output of the second comparator 307 is inverted, a counter value at that time is held by the latch circuit 308. If the ADC 205 outputs N bits, the counter need only perform counting for at most (N−2) bits in this example. Data expansion units 309 and 310 add a predetermined number of bits to the upper or lower side of the count data held by the latch circuit 308. If the counter performs counting the N-bit output up to (N−2) bits, 2-bit 0s are added to the upper or lower side of the count data, and the resultant data is output as N-bit data. Subsequently, an output data selection unit 311 selects one data in accordance with the output of the FF 306, and outputs the selected data to the data memory 208.

For the sake of descriptive convenience, A/D conversion when the pixel signal has a voltage lower than the reference voltage Vm will be referred to as a low luminance conversion mode hereinafter, and A/D conversion when the pixel signal has a voltage equal to or higher than the reference voltage Vm will be referred to as a high luminance conversion mode hereinafter. In this example, since the pixel signal is classified into that having a low luminance and that having a high luminance, the counter performs counting up to (N−2) bits by changing the voltage of the high luminance signal to ¼, and the signal is converted into N bits and output, it is possible to prevent the time required for A/D conversion from being prolonged.

Figure 5:
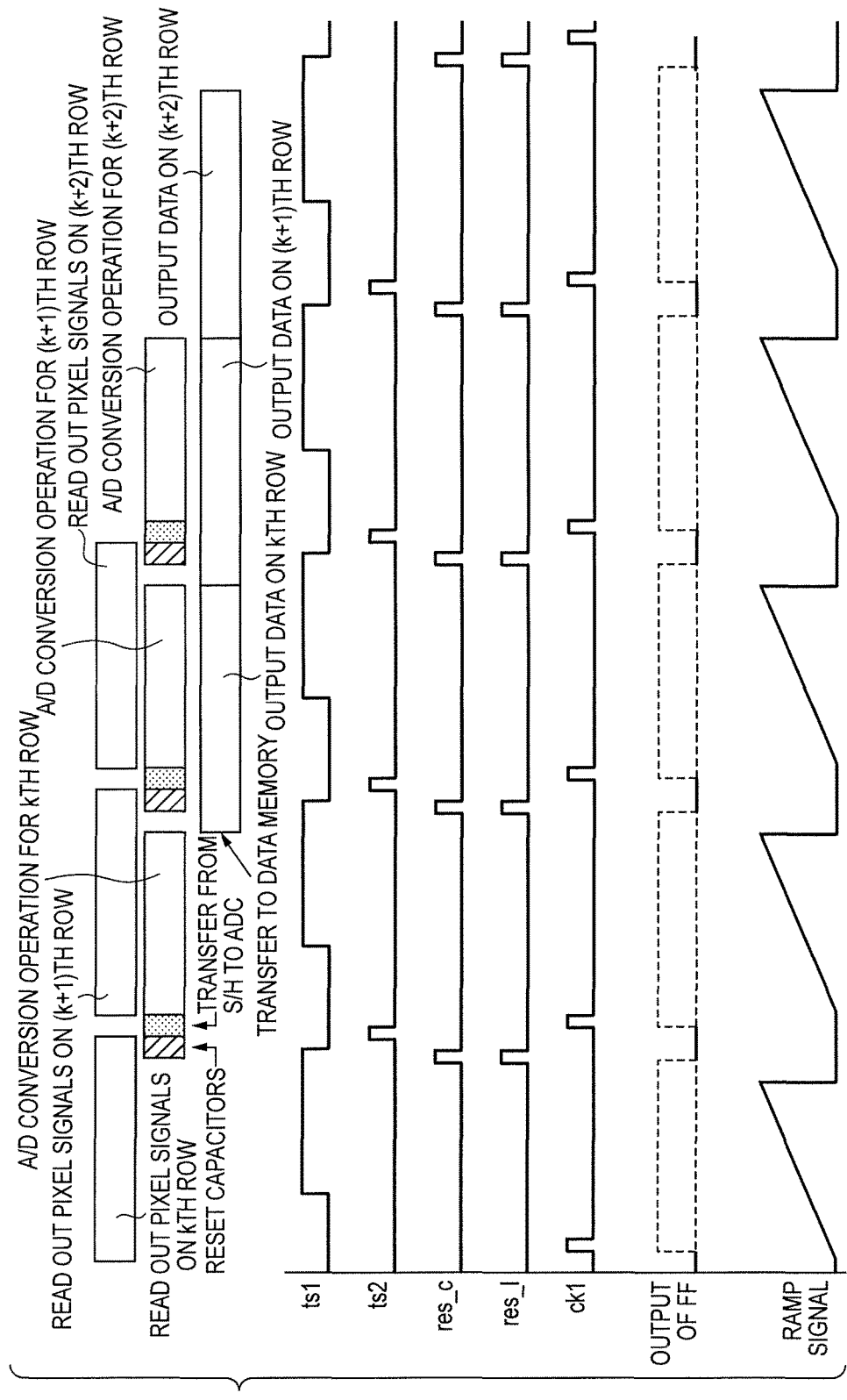
FIG. 5 is a timing chart showing a readout operation according to the embodiment of the present invention.

The operation timing of the image sensor 102 will be explained with reference to the timing chart of FIG. 5 which shows the operation of the image sensor 102. During an operation of reading out pixels on the kth row, a signal ts1 is set at high level, and pixel signals of the respective pixels on the kth row are stored in the first capacitor 302. After the signal ts1 is set at low level, the second signal transfer switch 401 is turned on by setting a signal ts2 at high level, thereby transferring the signals in the first capacitor 302 to the second capacitor 402 and third capacitor 403 via the buffer 303.

After the second signal transfer switch 401 is turned off by setting the signal ts2 at low level, a pulse ck1 at high level is input to the FF 306 ck1, and an output value of the first comparator 305 which is the result of comparing the pixel signal with the reference voltage Vm is loaded and held in the FF 306. The output of the FF 306 is input to the OR gate 406, thereby causing the signal amplitude control unit 304 to change the signal amplitude. After that, the ramp signal generation circuit 206 generates a ramp signal, and then an A/D conversion operation is performed for the pixel signals on the kth row. While performing the A/D conversion operation for the pixel signals on the kth row, a readout operation is simultaneously performed for the (k+1)th row, and pixel signals on the (k+1)th row are transferred to the first capacitor 302.

Upon completion of the A/D conversion operation for the pixel signals on the kth row, digital data having undergone A/D conversion are transferred to the data memory 208. After that, the horizontal scanning circuit 209 sequentially outputs the data on the kth row from the image sensor 102. When the signal res_1 and a signal res_c are set at high level after transferring the data to the data memory, the FF 306, second capacitor 402, and third capacitor 403 are reset to prepare for conversion on the next row.

Figure 6:
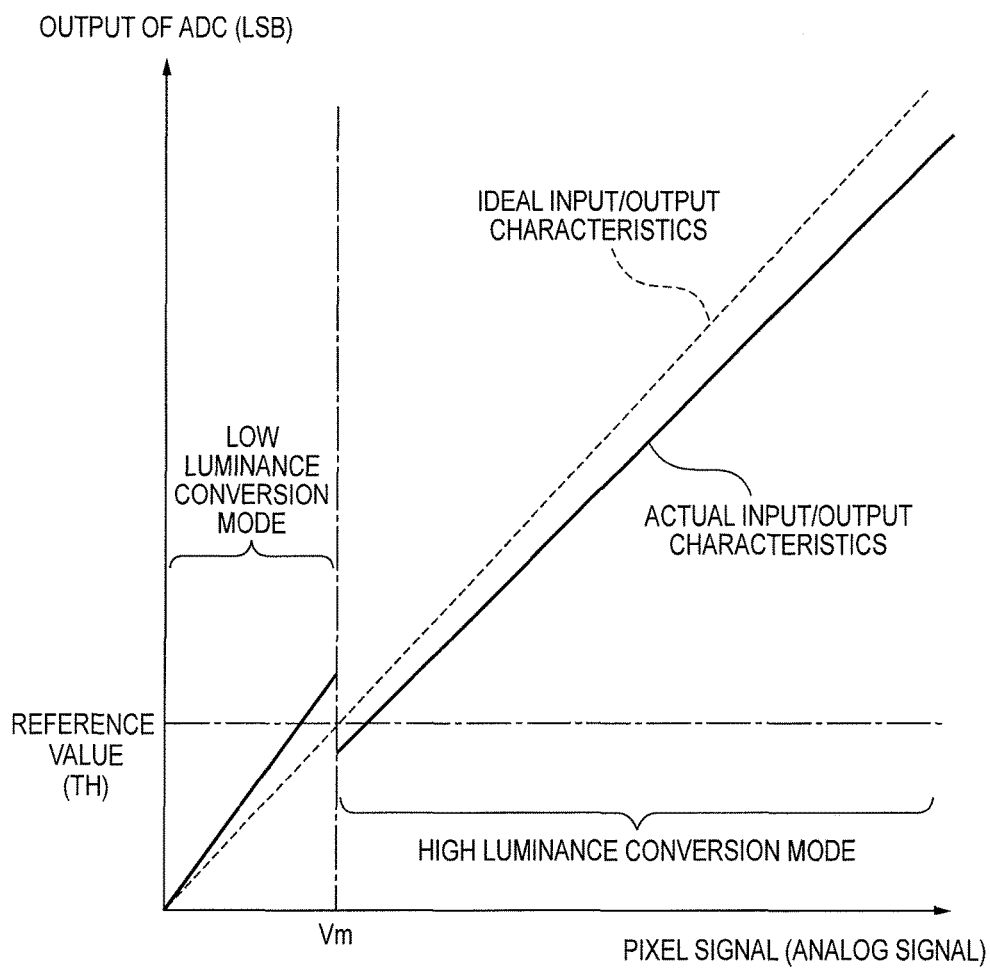
FIG. 6 is a graph showing the input/output characteristics of A/D conversion according to the first embodiment of the present invention.

FIG. 6 is a graph schematically showing the relationship between a pixel signal as an analog input signal and an A/D conversion output as N-bit digital data at the time of output to the data memory 208, that is, the input/output characteristics of the ADC 205. Assume that the reference voltage Vm is A/D-converted to ideally output a code of 4096 LSB. Assume that ideal input/output characteristics are obtained. In this case, if the input signal coincides with the reference voltage Vm as indicated by a dotted line, the output code is 4096 LSB, and input/output characteristics when the input signal has a voltage equal to or higher than the reference voltage Vm are linearly connected with those when the input signal has a voltage smaller than the reference voltage Vm. However, due to capacitance variations of the signal amplitude control units 304 and the characteristics of the short-circuiting switches, the relative relationship between the amplitude of the ramp signal and that of the pixel signal may actually deviate from estimated one when the pixel signal has a low luminance or a high luminance. In this case, actual input/output characteristics deviate from the ideal input/output characteristics, as indicated by solid lines. At the reference voltage Vm as a boundary, a step appears in the input/output characteristics, and the slope of the input/output characteristics changes.

Figure 7:
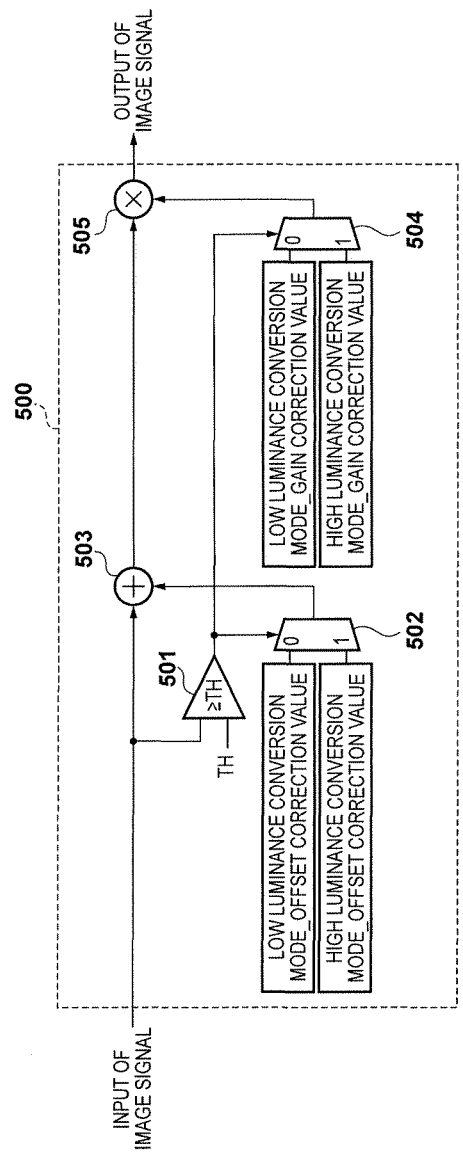
FIG. 7 is a circuit diagram showing the arrangement of a DFE according to the first embodiment of the present invention.

A linearity correction unit 500 of the DFE 109 for correcting the deviation in the input/output characteristics will be explained with reference to FIG. 7. A comparison unit 501 compares the pixel data of the input image signal with a first reference value (TH) for each pixel. Assume that the first reference value TH is 4096LSB corresponding to the digital conversion value of the reference voltage Vm for the ideal input/output characteristics. Based on the output of the comparison unit 501, an offset correction value selection unit 502 selects one of an offset correction value for the high luminance conversion mode and that for the low luminance conversion mode. In the input/output characteristics of A/D conversion for a low luminance or high luminance, each offset correction value is used to correct the deviation from the ideal input/output characteristics caused by the step in the input/output characteristics at the reference voltage Vm as a boundary, which is caused by capacitance variations of the signal amplitude control units 304 or the like. A method of obtaining a correction value will be described later.

If the output of the comparison unit 501 is "1", that is, the image signal has a value equal to or larger than the first reference value TH, the offset correction value for the high luminance conversion mode is selected. On the other hand, if the output of the comparison unit 501 is "0", that is, the image signal has a value smaller than the reference value TH, the offset correction value for the low luminance conversion mode is selected. It is possible to set a different value for each column of the image sensor 102 (the ADC 205 arranged for each column) as each offset correction value. That is, each of the offset correction value for the low luminance conversion mode and that for the high luminance conversion mode is obtained for the number of columns of the image sensor 102. An adding unit 503 receives the image signal and the correction value selected by the offset correction value selection unit 502, and performs offset correction for the image signal.

The output of the comparison unit 501 is also transmitted to a gain correction value selection unit 504. A gain correction value is used to correct the slope of the input/output characteristics due to capacitance variations of the signal amplitude control units 304 or the like. Based on the output of the comparison unit 501, the gain correction value selection unit 504 selects one of a gain correction value for the high luminance conversion mode and that for the low luminance conversion mode.

If the output of the comparison unit 501 is "1", that is, the image signal has a value equal to or larger than the first reference value TH, the gain correction value for the high luminance conversion mode is selected. On the other hand, if the output of the comparison unit 501 is "0", that is, the image signal is smaller than the first reference value TH, the gain correction value for the low luminance conversion mode is selected. It is possible to set a different value for each column of the image sensor 102 (the ADC 205 arranged for each column) as each gain correction value. That is, each of the gain correction value for the low luminance conversion mode and that for the high luminance conversion mode is obtained for the number of columns of the image sensor 102. A multiplication unit 505 receives the resultant image signal obtained by performing offset correction by the adding unit 503 and the gain correction value selected by the gain correction value selection unit 504, and performs gain correction for the image signal. The result of performing gain correction by the multiplication unit 505 is output to the succeeding stage (DSP 103). Note that a different offset correction value and a different gain correction value are set for each column in this example. However, a common correction value may be used for a plurality of columns as long as the AD conversion characteristics of the columns coincide with each other.

Figure 8:
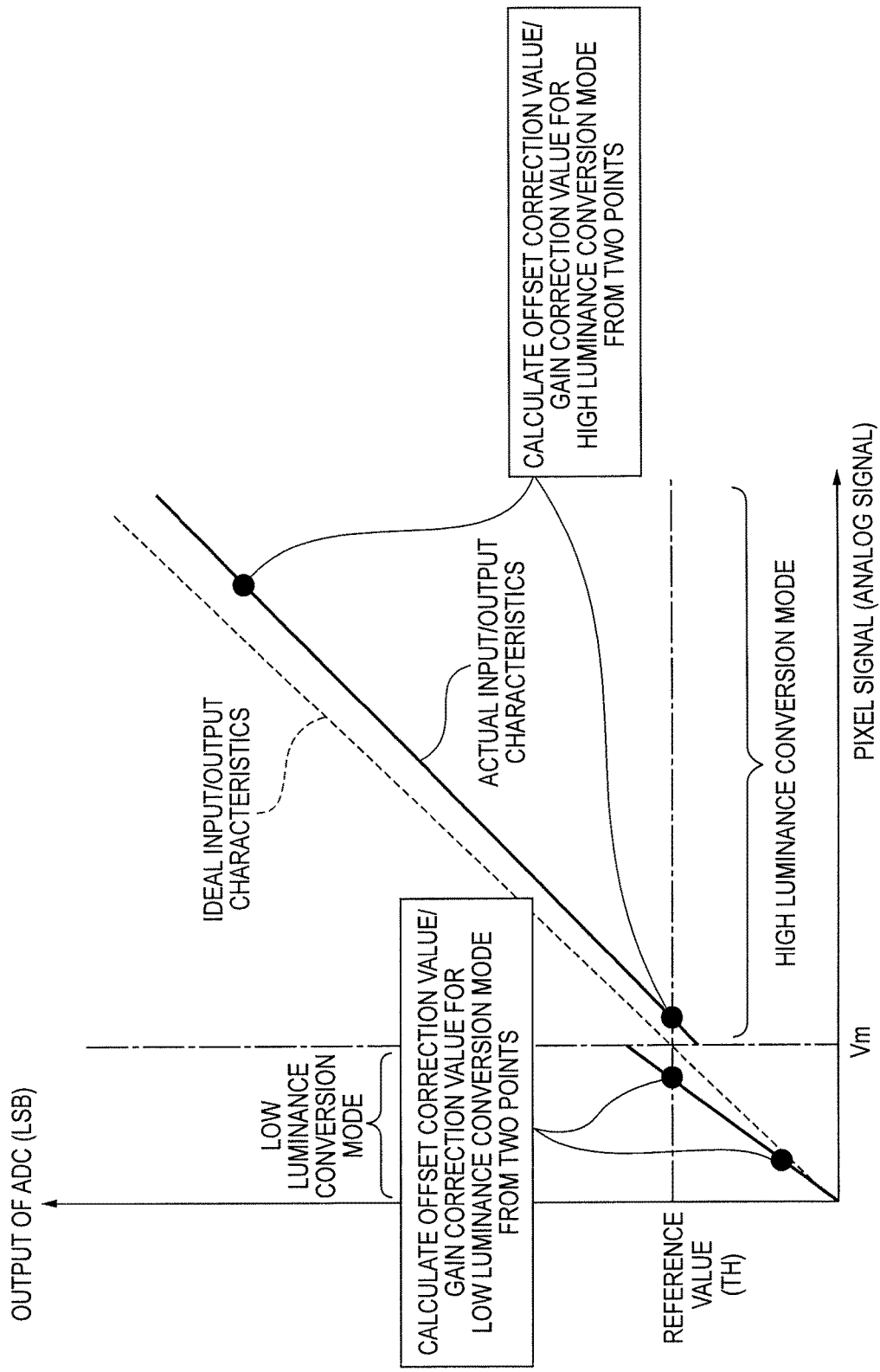
FIG. 8 is a graph showing the input/output characteristics of A/D conversion and an example of obtaining of an offset correction value/gain correction value according to the embodiment of the present invention.

Alternatively, it is possible to preset an offset correction value and a gain correction value. It is also possible to obtain the values in a manufacturing process in a factory. For example, as shown in FIG. 8, reference images are captured under at least two known exposure conditions that the signal level of the pixel signal is lower than the reference voltage Vm, and the input/output characteristics of the ADC 205 are obtained from the two input/output characteristic points, thereby calculating an offset correction value and gain correction value for the low luminance conversion mode. Similarly, an offset correction value and gain correction value for the high luminance conversion mode are calculated from reference images captured under at least two exposure conditions that the signal level of the pixel signal is higher than the reference voltage Vm. Note that FIG. 8 shows a case in which correction values are calculated from two input/output characteristic points but the present invention is not limited to this. Images may be obtained under three or more conditions, and each correction value may be calculated by a method such as the least squares method. Although the correction accuracy decreases, correction values may be calculated using images obtained under one condition in the low luminance conversion mode and high luminance conversion mode.

With the above arrangement, the input/output characteristics of the ADC 205 can be corrected to be closer to the ideal input/output characteristics, thereby obtaining a corrected image having good image quality.

Second Embodiment

In the first embodiment, a case in which the first reference value TH is TH=4096 LSB corresponding to the digital conversion value of the reference voltage Vm has been explained. If, however, the input/output characteristics of A/D conversion as shown in FIG. 6 are obtained, data which has been converted in the low luminance conversion mode even though the output value is equal to or larger than 4096 LSB or data which has been converted in the high luminance conversion mode even though the output value is smaller than 4096 LSB may be output. If, therefore, TH=4096 LSB is set as a threshold to perform correction as in the first embodiment, pixel data which has been actually converted in the low luminance conversion mode may be corrected with a correction value for the high luminance conversion mode since 4096LSB is exceeded. Alternatively, pixel data converted in the high luminance conversion mode may be corrected with a correction value for the low luminance conversion mode. If correction is performed with a wrong correction value as described above, a corrected amount becomes noise, and thus the image quality may degrade at a level around the first reference value TH (4096). To obtain high image quality, it is desirable that no such degradation occurs in image quality. This embodiment will be described below, but a repetitive description of a part described in the first embodiment will be omitted.

In this embodiment, accurate correction is executed for all pixel signals by avoiding a situation in which results of the low luminance conversion mode and high luminance conversion mode overlap each other to output the equal digital values, as shown in FIG. 6.

Figure 9:
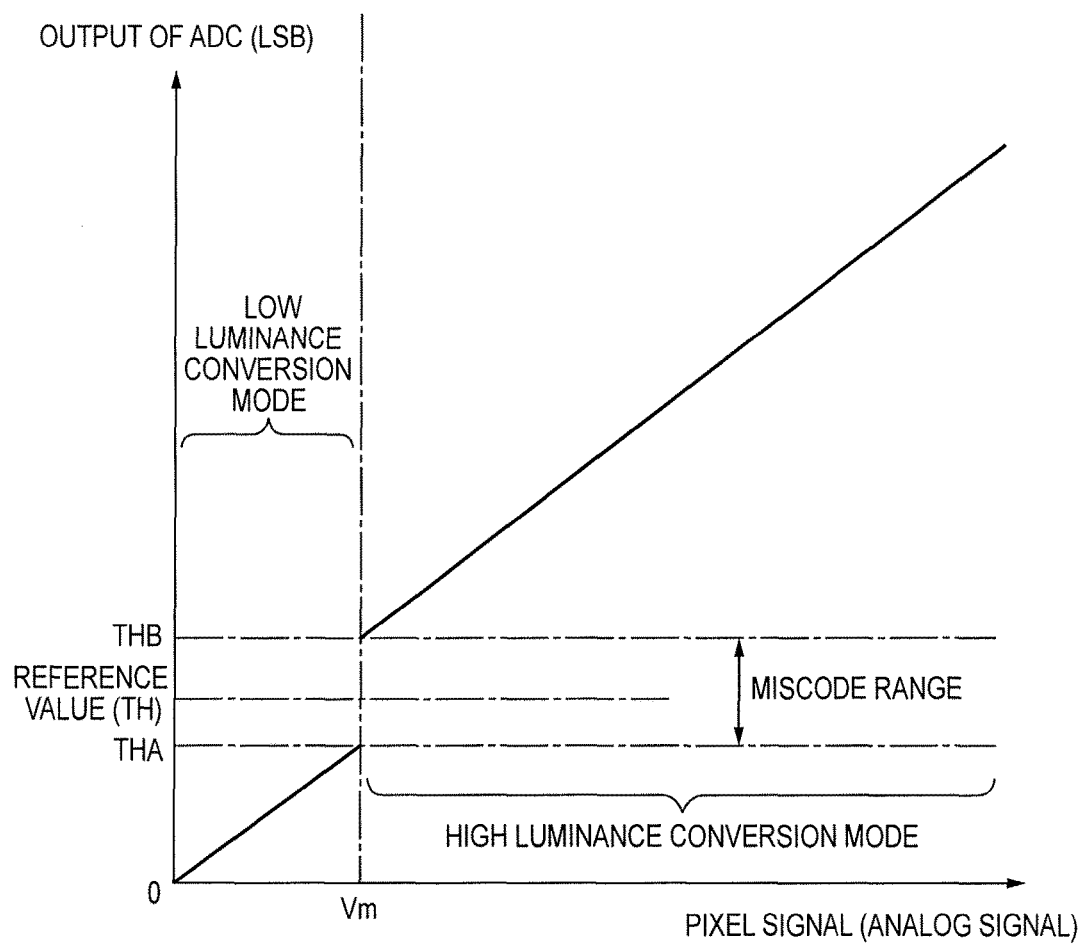
FIG. 9 is a graph showing the input/output characteristics of A/D conversion according to the second embodiment of the present invention.

FIG. 9 shows the input/output characteristics of an ADC 205 according to this embodiment. When a signal of a level near a reference voltage Vm is converted in the low luminance conversion mode, A/D conversion is performed so that the output value of the ADC 205 becomes equal to or smaller than a second reference value (THA) smaller than the first reference value (TH). When a signal of a level near the reference voltage Vm is converted in the high luminance conversion mode, A/D conversion is performed so that the output value of the ADC 205 becomes equal to or larger than a third reference value (THB) higher than the first reference value TH. That is, a portion (to be referred to as a miscode range hereinafter) is set, where output values in different A/D conversion modes do not cross each other near the first reference value TH of the input/output characteristics of the ADC 205. This can prevent a conversion result in the low luminance conversion mode from exceeding the first reference value TH even if a gain or offset deviates to some extent due to variations in manufacturing. It is also possible to prevent a conversion result in the high luminance conversion mode from becoming smaller than the first reference value TH.

The input/output characteristics including such miscode range can be obtained by increasing the value of a pixel signal in the high luminance mode by decreasing the gain of a CDS amplifier 203 and decreasing an amplitude change amount in a signal amplitude control unit 304 (for example, ×1/3.8). The amplitude change amount of the signal amplitude control unit 304 can be changed by changing the capacitance ratio between the capacitance value of a second capacitor 402 and that of a third capacitor.

In an arrangement having a plurality of kinds of ramp signals, it is possible to obtain input/output characteristics including a miscode range near the first reference value TH by adjusting the slope of each ramp signal and an offset (start point).

As described above, even if a correction value to be used is switched at the first reference value TH as a boundary, converted values do not overlap each other by setting a miscode range between a low luminance and a high luminance. This can prevent wrong correction, thereby obtaining good image quality.

Third Embodiment

In the second embodiment, the arrangement for preventing the occurrence of wrong correction has been explained. However, in the method of the second embodiment, the miscode range as shown in FIG. 9 is set in the input/output characteristics. Therefore, bits for the miscode range cannot be used, thereby slightly degrading the dynamic range of the signal. In this embodiment, a method will be described, in which information about an A/D conversion mode is transmitted to a DFE 109 for correcting an offset and gain, thereby preventing the sacrifice of the dynamic range.

Figure 10:
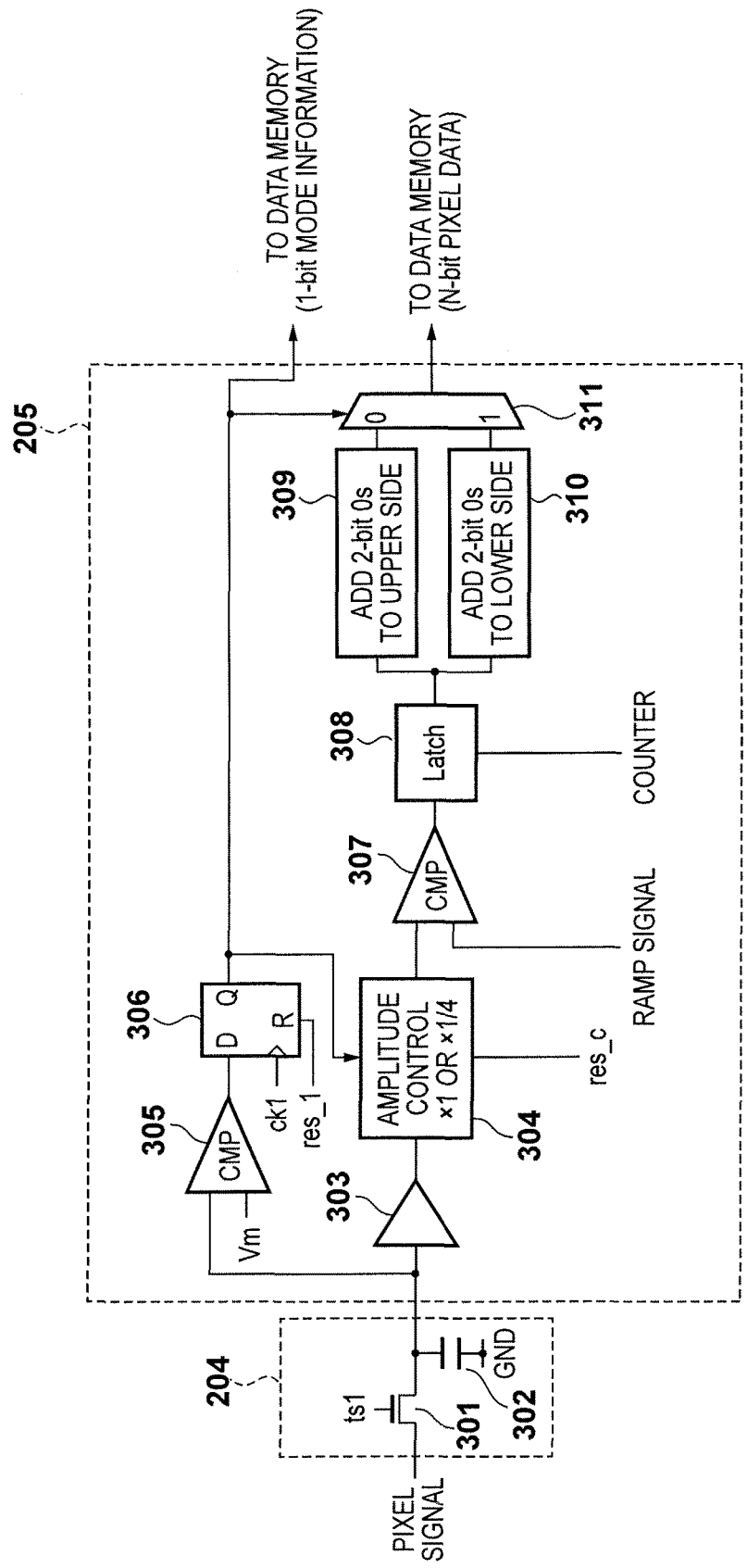
FIG. 10 is a circuit diagram showing the arrangement of a sample and hold circuit and an A/D conversion circuit according to the third embodiment of the present invention.

The operation of an ADC 205 according to this embodiment will be described with reference to FIG. 10. The ADC 205 outputs an output from a FF 306 to a data memory 208 as 1-bit information while outputting N-bit image data to the data memory 208. This 1-bit information is mode information indicating whether the pixel has been converted in the low luminance conversion mode or the high luminance conversion mode.

Figure 11:
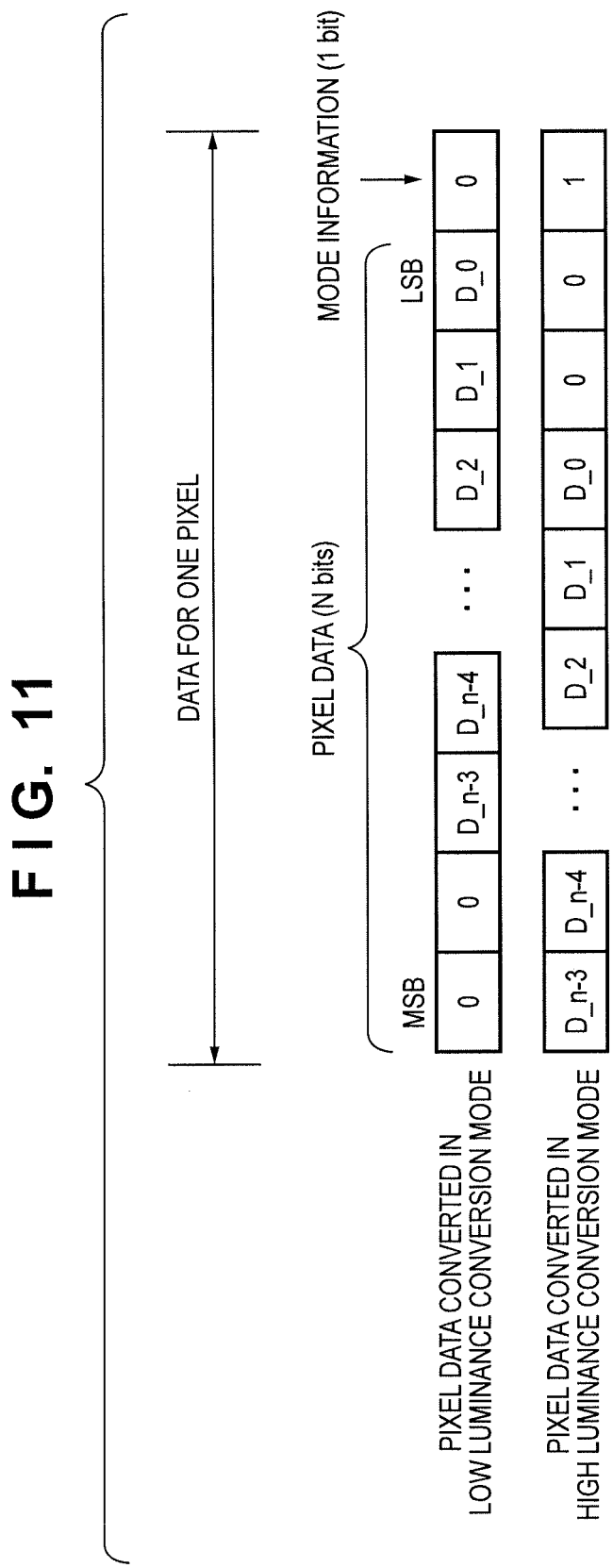
FIG. 11 is a view showing data for one pixel output from an image sensor according to the third embodiment of the present invention.

Data for one pixel output from an image sensor 102 according to this embodiment will be explained with reference to FIG. 11. The image sensor 102 outputs N-bit pixel data and 1-bit mode information for each pixel. The DFE 109 performs correction processing for the data of each pixel based on the mode information.

Figure 12:
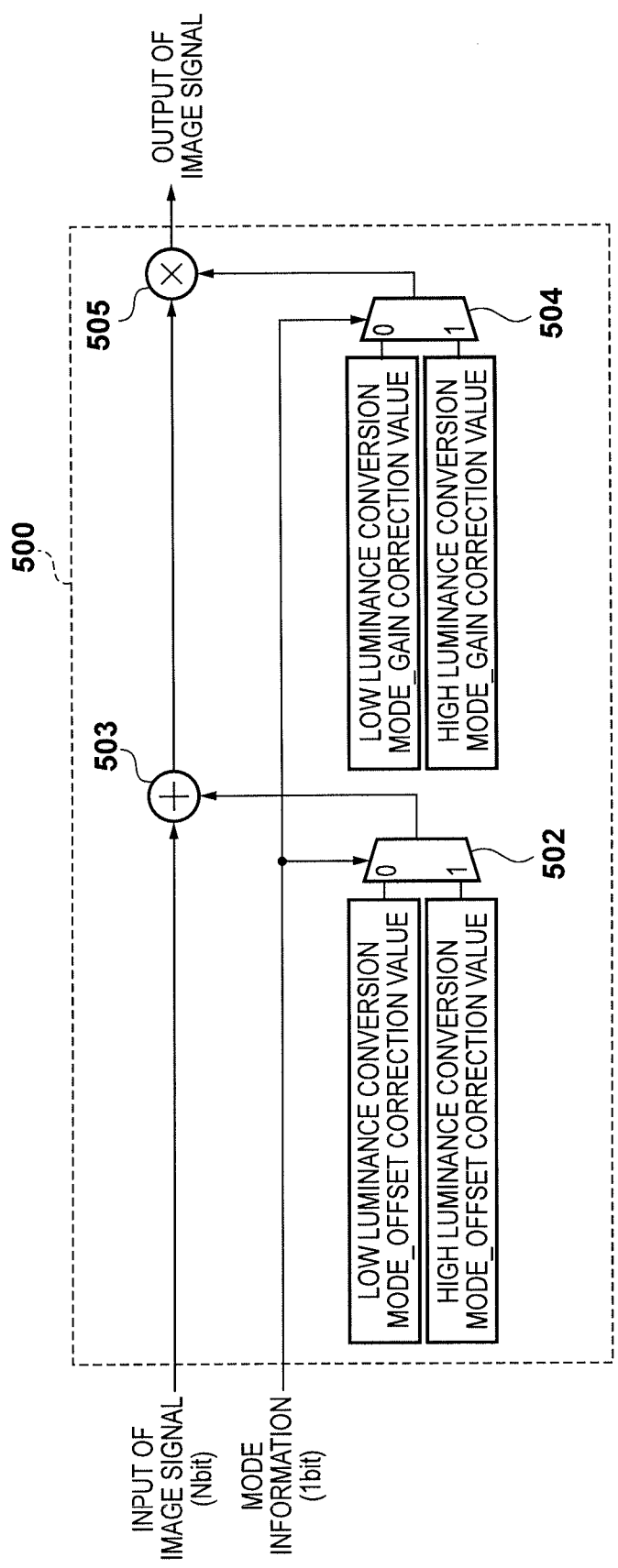
FIG. 12 is a circuit diagram showing the arrangement of a DFE according to the third embodiment of the present invention.

FIG. 12 shows an example of the arrangement of the DFE 109 for performing linearity correction according to this embodiment. The mode information input to the DFE 109 together with the pixel data serves as a selection signal for an offset correction value selection unit 502 and a gain correction value selection unit 504. This allows the data of each pixel to be accurately corrected according to each conversion mode without undergoing wrong correction. Since it is not necessary to set a miscode range, it is possible to effectively use the dynamic range.

Fourth Embodiment

In the arrangement of the third embodiment, the data output from the image sensor 102 to the DFE 109 has (N+1) bits (that is, N bits of the pixel data+1 bit of the mode information), and thus it is necessary to increase the data transfer rate by 1 bit. In this embodiment, an arrangement which makes a data amount output from an image sensor 102 as small as possible, and decreases the data transfer rate will be described.

Figure 13:
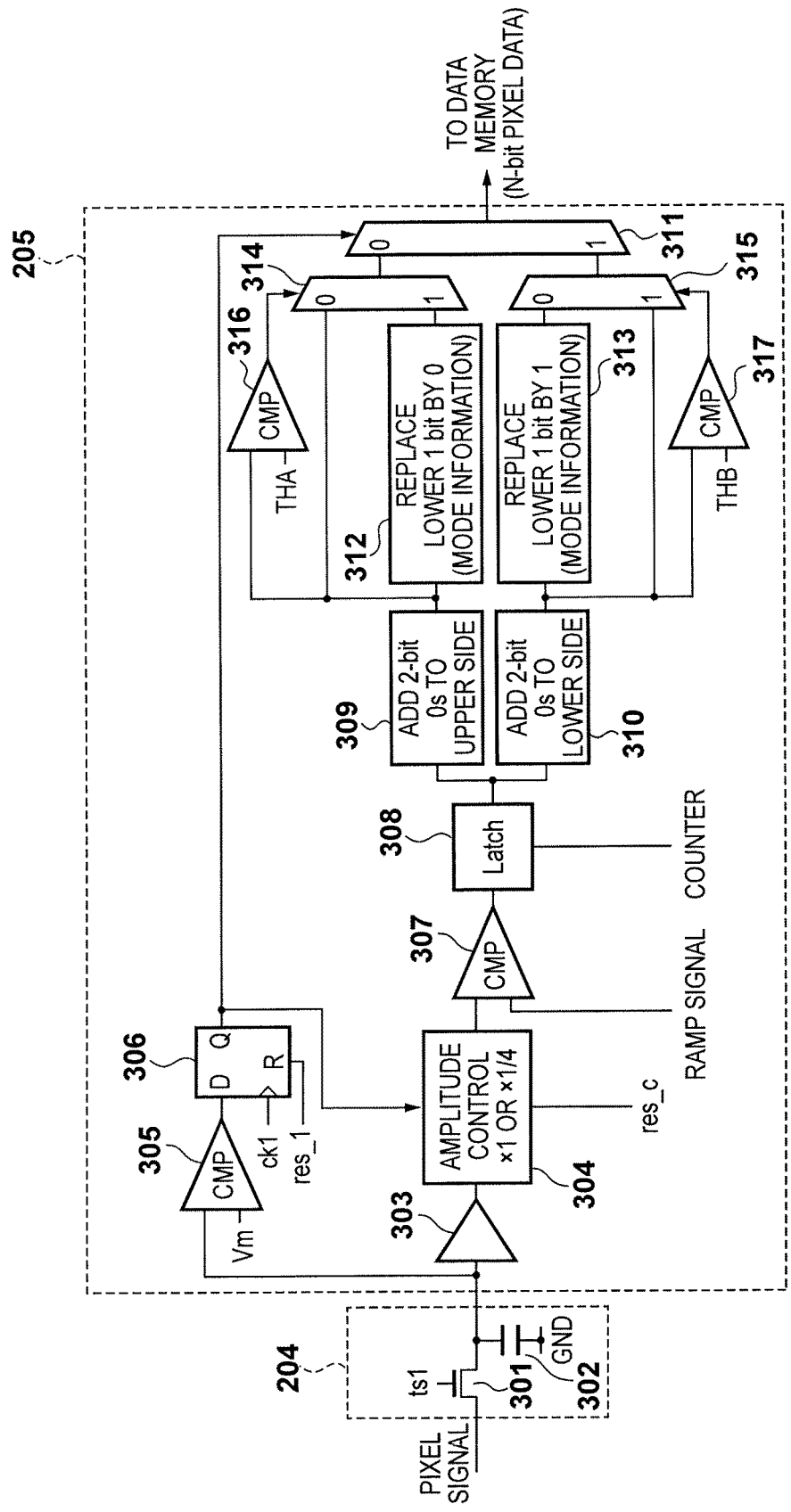
FIG. 13 is a circuit diagram showing a sample and hold circuit and an A/D conversion circuit according to the fourth embodiment of the present invention.

An example of the arrangement of a sample and hold circuit 204 and an ADC 205 on each column of the image sensor 102 according to this embodiment will be explained with reference to FIG. 13. A lower bit replacement unit 312 replaces the lower 1 bit of pixel data output from a bit extension unit 309 by 0. A lower bit replacement unit 313 replaces the lower 1 bit of pixel data output from a bit extension unit 310 by 1. The outputs of the bit extension units 309 and 310 are also connected to comparators 316 and 317, respectively. The comparator 316 compares the value of the pixel data with a second reference value THA. If the value of the pixel data is equal to or larger than the second reference value THA, the comparator 316 outputs "1" to a low luminance side data selection unit 314. Alternatively, if the value of the pixel data is smaller than the second reference value THA, the comparator 316 outputs "0" to the low luminance side data selection unit 314. The comparator 317 compares the value of the pixel data with a third reference value THB. If the value of the pixel data is equal to or larger than the third reference value THB, the comparator 317 outputs "1" to a high luminance side data selection unit 315. Alternatively, if the value of the pixel data is smaller than the third reference value THB, the comparator 317 outputs "0" to a high luminance side data selection unit 315.

Figure 14:
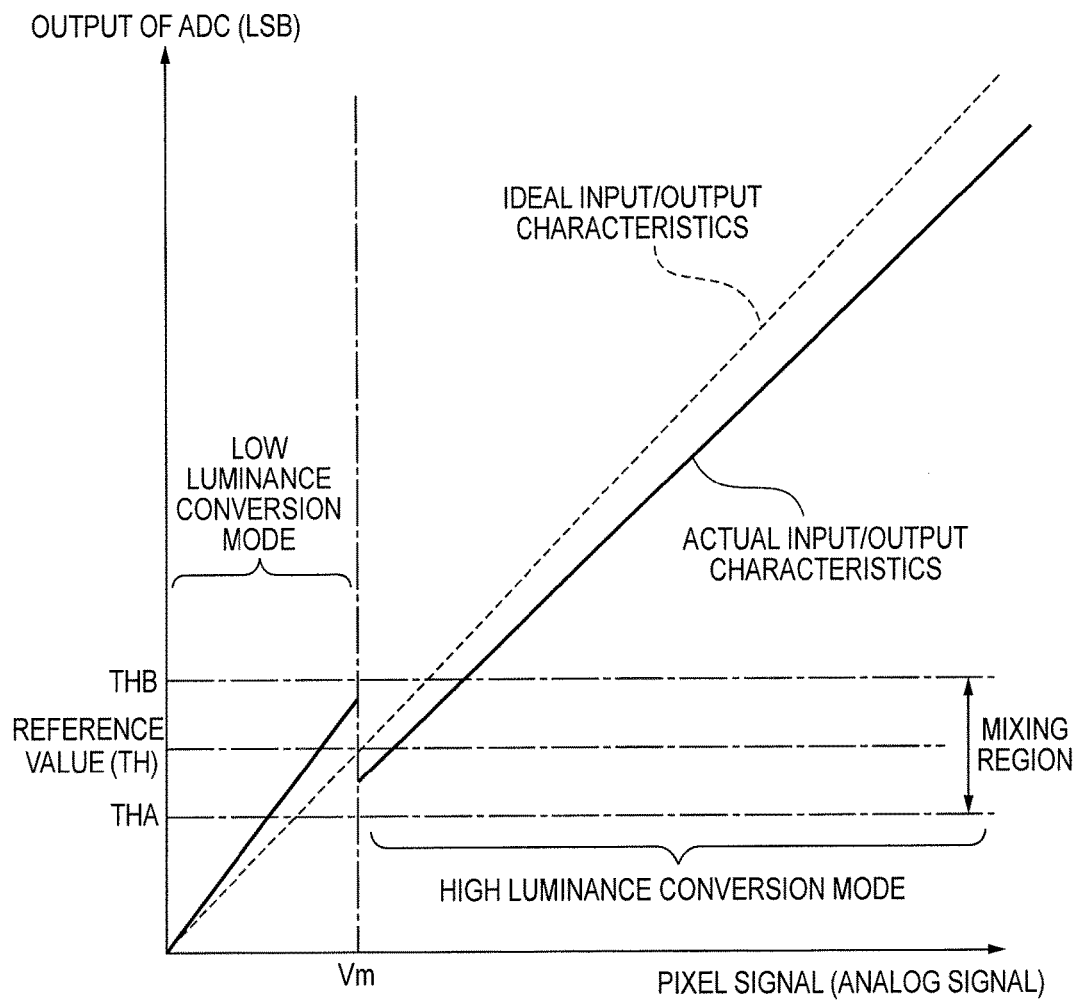
FIG. 14 is a graph showing the input/output characteristics of A/D conversion according to the fourth embodiment of the present invention.

The second reference value THA is set at a level lower than that of the first reference value TH (4096) (THA<TH), as shown in FIG. 14. The third reference value THB is set at a level higher than that of the first reference value TH (THB>TH). At this time, the levels of the second reference value THA and third reference value THB are set so that a signal converted in the low luminance conversion mode is always obtained when the value of the pixel data is smaller than the second reference value THA, and a signal converted in the high luminance conversion mode is always obtained when the value of the pixel data is equal to or larger than the third reference value THB. In a region where the pixel value falls within the range from the second reference value THA (inclusive) to the third reference value THB (exclusive), even if the equal output values are output from the bit extension units 309 and 310, a signal converted in the low luminance conversion mode and that converted in the high luminance conversion mode may mix. This region will be referred to as a "mixing region" hereinafter for the sake of convenience. As shown in FIG. 14, the mixing region includes a state in which input/output characteristics overlap each other.

Referring back to FIG. 13, the low luminance side data selection unit 314 selects and outputs one of the output of the bit extension unit 309 and that of the lower bit replacement unit 312 in accordance with the output of the comparator 316. Similarly, the high luminance side data selection unit 315 selects and outputs one of the output of the bit extension unit 310 and that of the lower bit replacement unit 312 in accordance with the output of the comparator 317. A subsequent output data selection unit 311 selects one of the output of the low luminance side data selection unit 314 and that of the high luminance side data selection unit 315 in accordance with an output from an FF 306, and outputs the selected output to the data memory 208.

Figure 15:
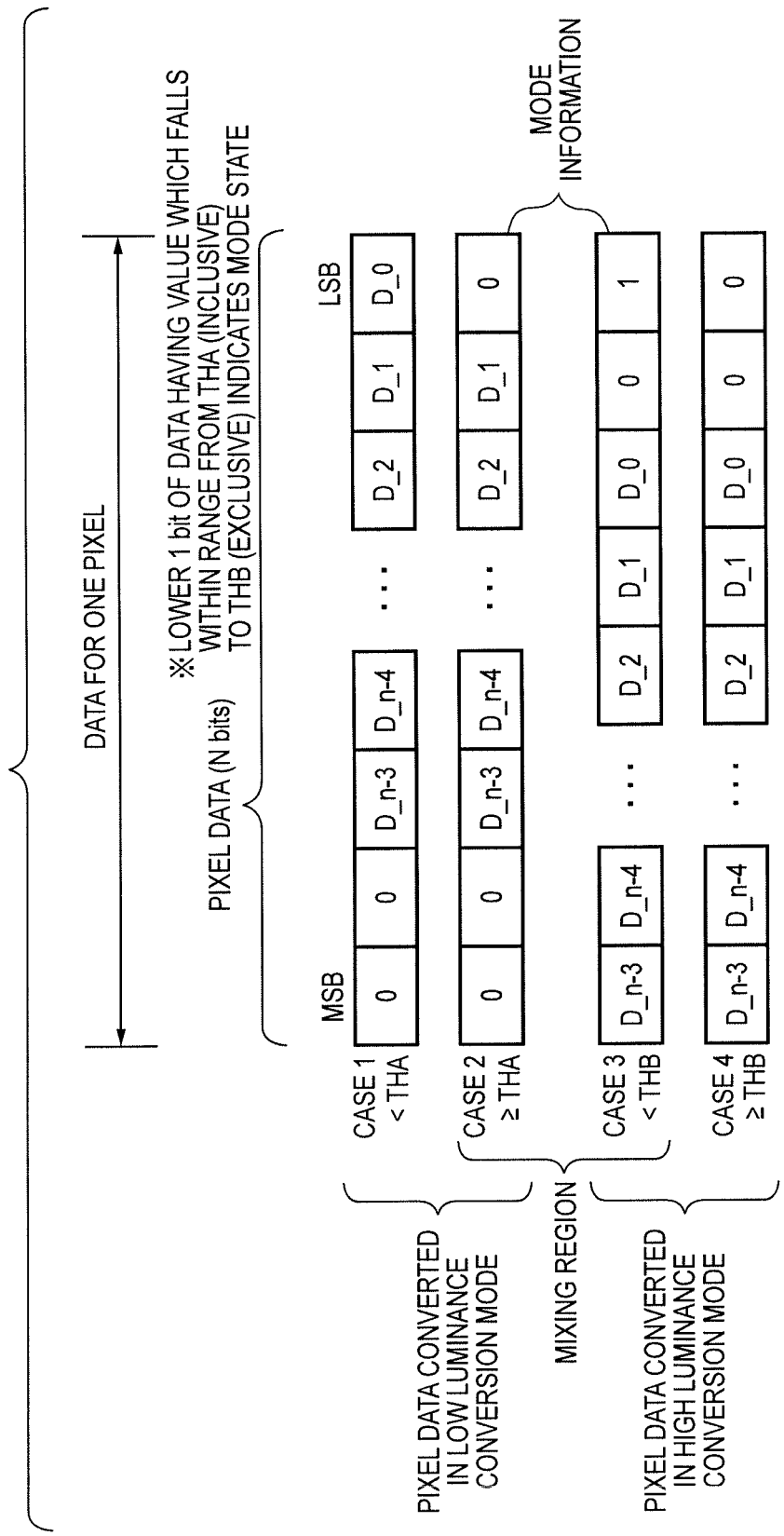
FIG. 15 is a view showing data for one pixel output from an image sensor according to the fourth embodiment of the present invention.

The data for one pixel output from the image sensor 102 according to this embodiment will be described with reference to FIG. 15. In FIG. 15, case 1 and case 2 show pixel data converted in the low luminance conversion mode, case 3 and case 4 show pixel data converted in the high luminance conversion mode. Furthermore, case 2 and case 3 show pixel data in the mixing region. In either case, the image sensor 102 outputs N-bit data for each pixel. In the mixing region, however, the least significant bit of the data is replaced by the mode information. A DFE 109 performs correction processing for the data of each pixel based on the mode information.

Figure 16:
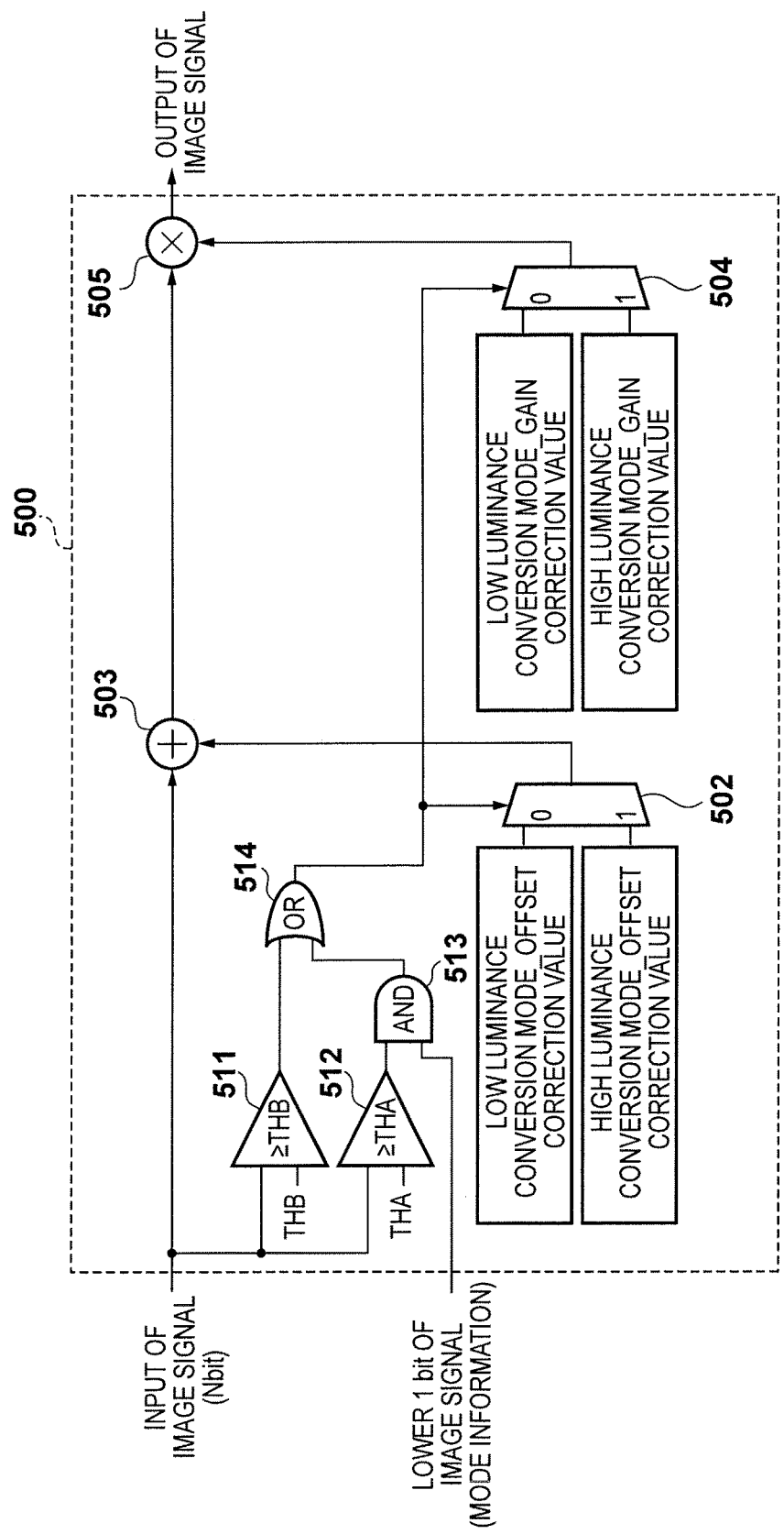
FIG. 16 is a circuit diagram showing the arrangement of a DFE according to the fourth embodiment of the present invention.

The DFE 109 for performing linearity correction according to this embodiment will be described with reference to FIG. 16. A comparator 511 compares the value of the image signal with the third reference value THB. If the value of the image signal is equal to or larger than the third reference value THB, the comparator 511 outputs "1". Alternatively, if the value of the image signal is smaller than the third reference value THB, the comparator 511 outputs "0". A comparator 512 compares the value of the image signal with the second reference value THA. If the value of the image signal is equal to or larger than the second reference value THA, the comparator 512 outputs "1". Alternatively, if the value of the image signal is smaller than the second reference value THA, the comparator 512 outputs "0". The input of an AND gate 513 is connected to the output of the comparator 512 and the least significant bit of the image signal, and the output of the AND gate 513 is connected to one input of an OR gate 514. The output of the comparator 511 is connected to the other input of the OR gate 514. Therefore, the output of the OR gate 514 is "1" when the value of the image signal is equal to or larger than the third reference value THB, or when the value of the image signal falls within the range from the second reference value THA (inclusive) and the third reference value THB (exclusive) and the least significant bit of the image signal is "1". That is, if conversion is performed in the high luminance mode, the output of the OR gate 514 is "1". If conversion is performed in the low luminance mode, the outputs of the comparator 511 and AND gate 513 are both "0", and thus the OR gate 514 outputs "0".

Each of an offset correction value selection unit 502 and gain correction value selection unit 504 selects a correction value in accordance with the output of the OR gate 514. In this example, also in the mixing region, it is possible to select a correction value for the low luminance mode in the low luminance conversion mode and select a correction value for the high luminance mode in the high luminance conversion mode.

With the above arrangement, it is possible to accurately correct the data of each pixel according to the conversion mode without increasing the data amount output from the image sensor 102, sacrificing the dynamic range, or increasing the data transfer rate. Note that in the arrangement of this embodiment, since the least significant bit of the pixel data is replaced by the mode information, the resolution of the signal may decrease by one bit and quantization noise may increase in the mixing region. Since, however, the mixing region is near the boundary between the low luminance conversion mode and the high luminance conversion mode, and includes a relatively large number of light signal components, light-shot noise is dominant, and thus the influence of the quantization noise on the image quality is small.

Fifth Embodiment

Figure 17:
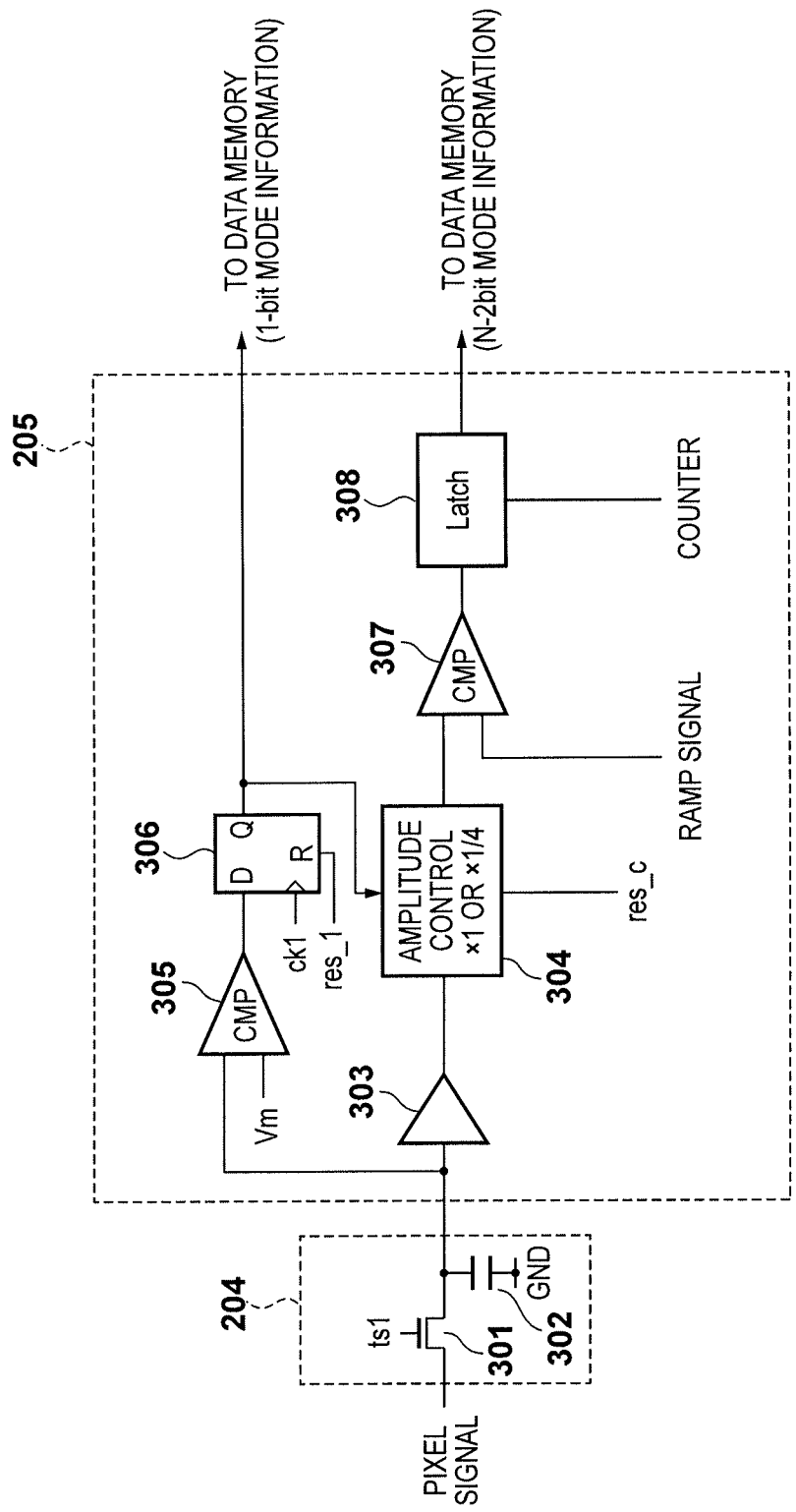
FIG. 17 is a circuit diagram showing the arrangement of a sample and hold circuit and an A/D conversion circuit according to the fifth embodiment of the present invention.
Figure 18:
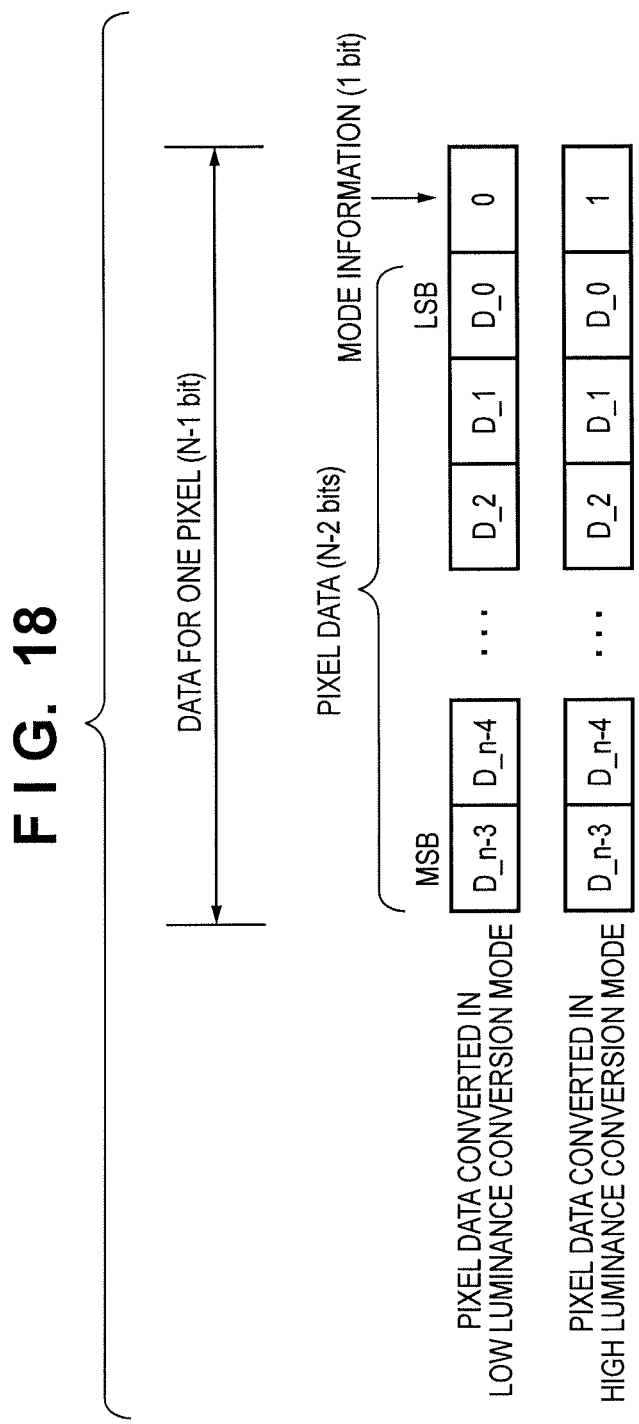
FIG. 18 is a view showing data for one pixel output from an image sensor according to the fifth embodiment of the present invention.
Figure 19:
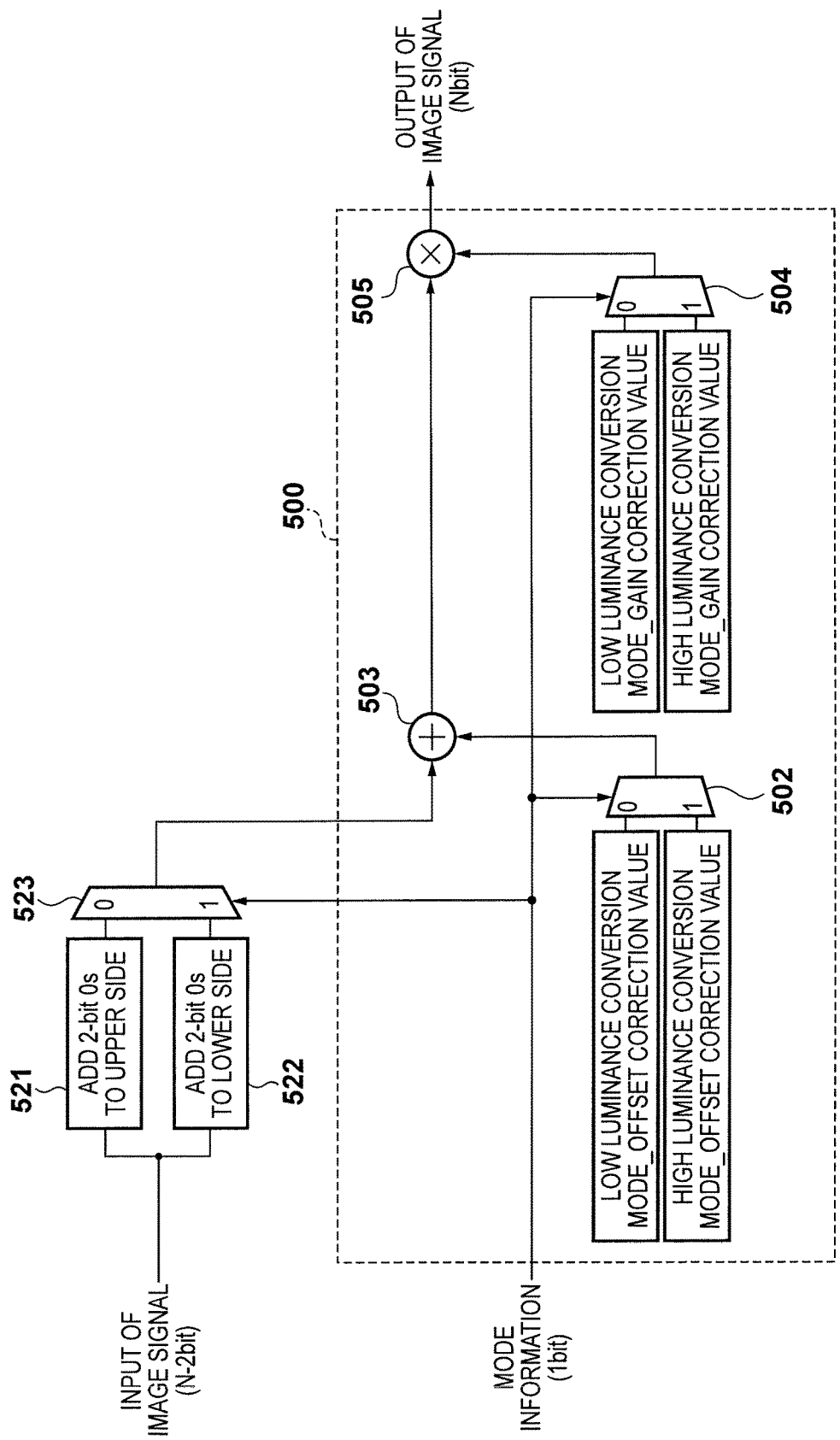
FIG. 19 is a circuit diagram showing the arrangement of a DFE according to the fifth embodiment of the present invention.

In the arrangement of the third embodiment, since the data output from the image sensor 102 to the DFE 109 has (N+1) bits (N bits of pixel data and 1 bit of mode information), the data transfer rate tends to increase. In this embodiment, an arrangement which decreases a data amount output from an image sensor 102 and decreases the data transfer rate will be described with reference to FIG. 17. An ADC 205 outputs an (N−2)-bit count result held by a latch circuit 308 to a data memory 208 intact together with 1-bit mode information from an FF 306. As a result, the image sensor 102 outputs (N−2)-bit pixel data (count result) and 1-bit mode information, that is, (N−1)-bit data in total for each pixel, as shown in FIG. 18. A DFE 109 separates the (N−2)-bit pixel data and 1-bit mode information from the (N−1)-bit data received from the image sensor. The DFE 109 adds a predetermined number of bits to the (N−2)-bit pixel data, resulting in extended N-bit data. FIG. 19 shows the main components of the DFE 109 according to this embodiment. Extension units 521 and 522 are bit extension units similar to the bit extension units 309 and 310 shown in FIG. 3, and add 2-bit "0"s to the upper and lower sides of the input image signal, respectively. Similarly to the output data selection unit 311 shown in FIG. 3, an output data selection unit 523 selects one of the outputs of bit extension units 506 and 507 in accordance with the mode information, and outputs the selected output to an adding unit 503. At this time, the DFE 109 extends the (N−2)-bit pixel data to N-bit data, and outputs the N-bit data. Subsequent processing is the same as that described in other embodiments and a description thereof will be omitted.

The above arrangement makes it possible to suppress the data amount output from the image sensor 102 to ((N−2) bits of image data)+(1 bit of mode information), that is, (N−1) bits in total, and to decrease the data transfer rate. Also, the circuit scale from the data memory 208 of the image sensor 102 to the DFE 109 can be suppressed.

Furthermore, it is possible to suppress data output from the image sensor 102 for each pixel to (N−2) bits by combining the embodiment with a method of replacing the least significant bit of the pixel data in the mixing region by mode information, as described in the fourth embodiment.

Although the embodiments of the present invention have been described above, the present invention is not limited to them and various modifications and changes can be made.

Figure 20:
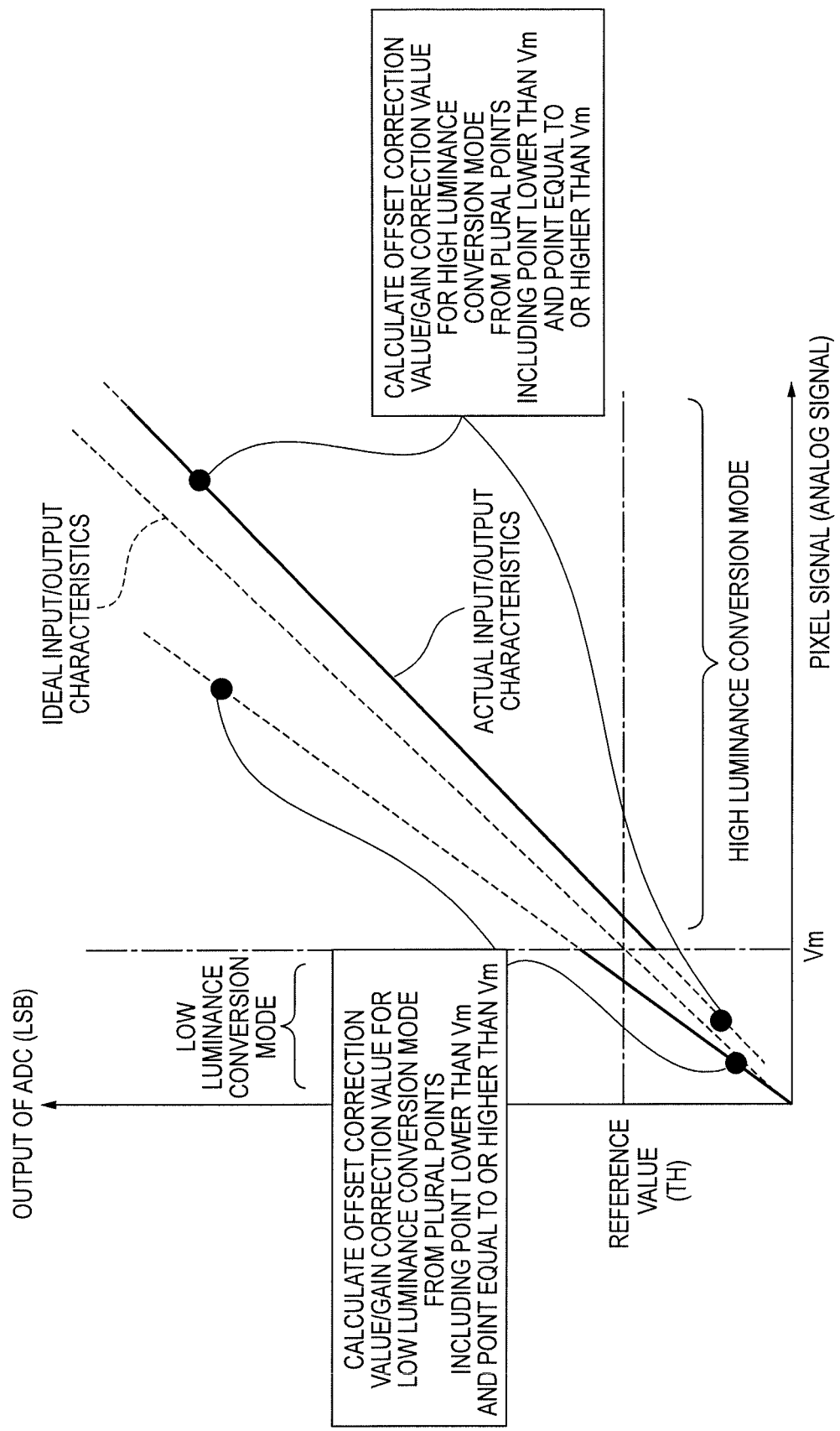
FIG. 20 is a graph showing the input/output characteristics of A/D conversion and an example of obtaining of an offset correction value/gain correction value according to the embodiment of the present invention.

In the method of obtaining an offset correction value and gain correction value as shown in FIG. 8, correction values are determined and obtained from a plurality of input/output characteristic points lower than the reference voltage Vm in the low luminance conversion mode or from a plurality of input/output characteristic points equal to or higher than the reference voltage Vm in the high luminance conversion mode. However, a correction value obtaining method is not limited to this, and measurement input/output characteristic points in each conversion mode may include, for example, a point lower than the reference voltage Vm and a point equal to or higher than the reference voltage Vm, as shown in FIG. 20. In this case, since it is possible to determine correction values within a wider signal range, and the influence of a measurement error at each measurement point is hardly exerted, and it is expected to improve the correction value calculation accuracy. In some cases, in only one of the high luminance conversion mode and the low luminance conversion mode, measurement input/output characteristic points may include a level lower than the reference voltage Vm and a level equal to or higher than the reference voltage Vm.

Figure 21:
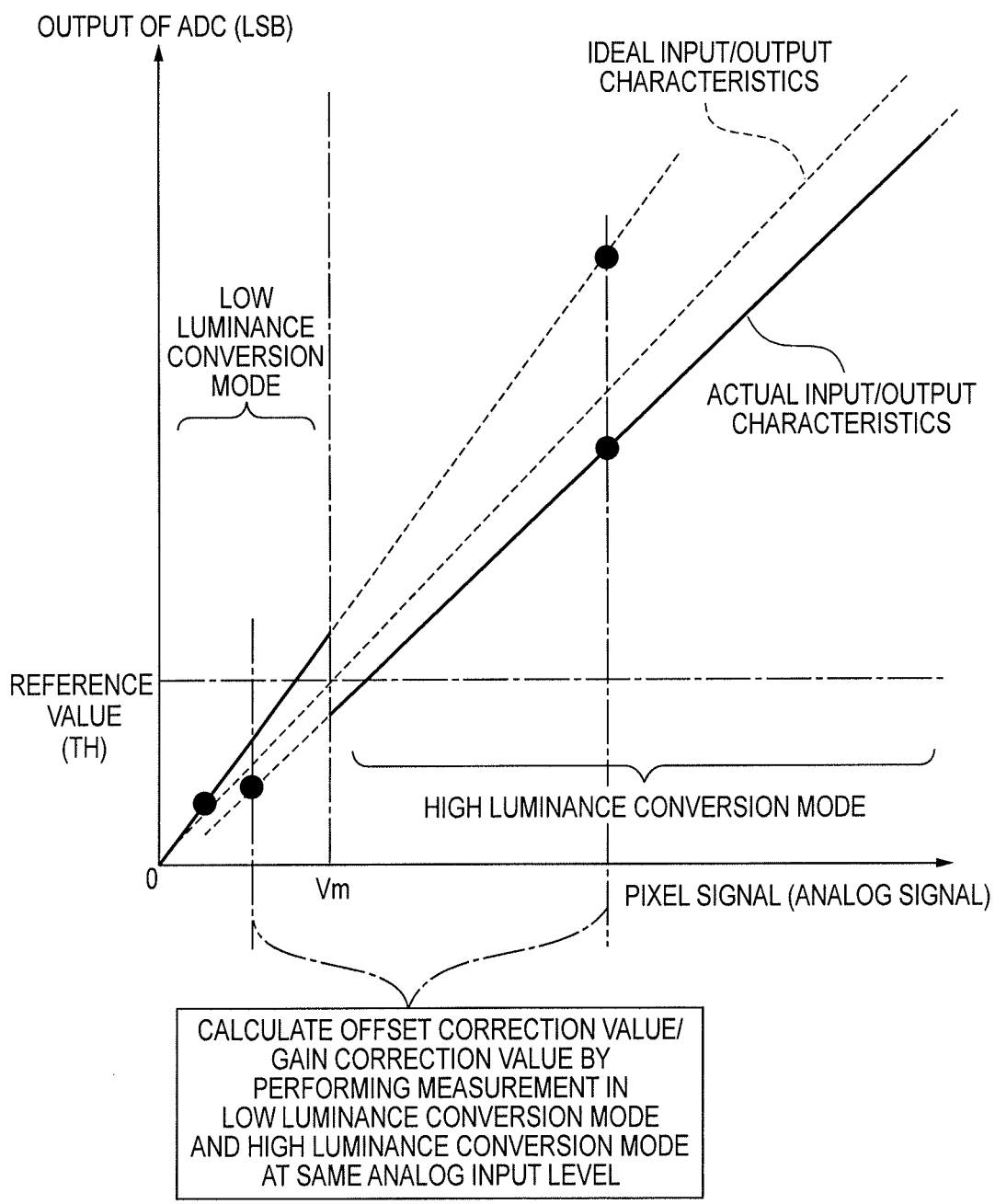
FIG. 21 is a graph showing the input/output characteristics of A/D conversion and an example of obtaining of an offset correction value/gain correction value according to the embodiment of the present invention.
Figure 22:
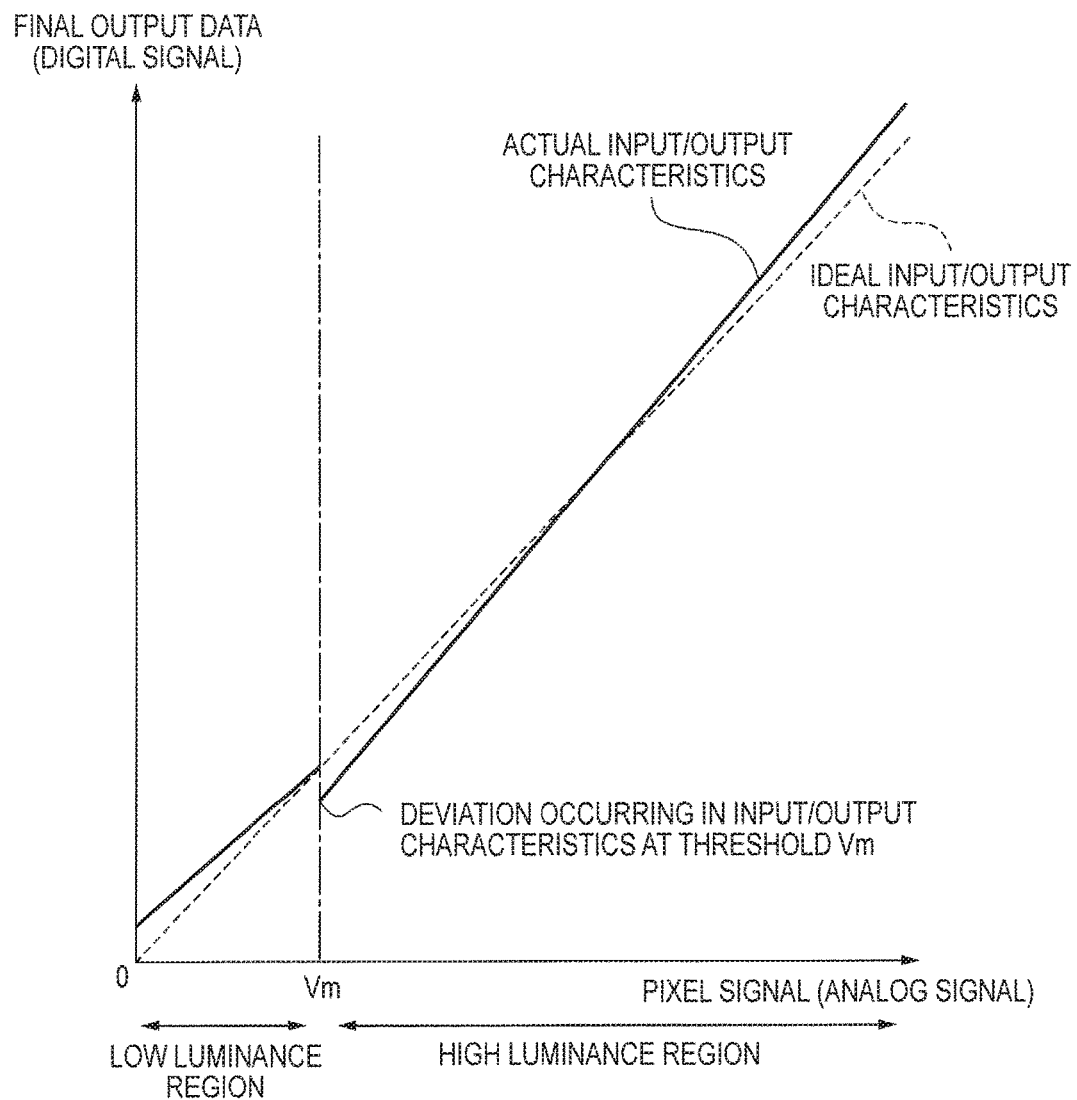
FIG. 22 is a graph showing a conventional example of the input/output characteristics of A/D conversion.

To reduce a measurement error in each mode, the same analog input voltage may be used for measurement in each mode, as shown in FIG. 21. In this case, it is possible to suppress an error which is caused by different voltages used in the respective modes.

It is also possible to obtain an offset correction value and gain correction value upon power-on of the image pickup apparatus or in accordance with an image pickup operation at the time of actual image pickup. In this case, to obtain correction values, a pseudo signal level for measurement is input at some point after pixels 201 of the image sensor 102 instead of the pixel signal, and the input/output characteristics of A/D conversion are measured.

In the above-described embodiments, correction of the input/output characteristics in A/D conversion when the conversion mode is switched between the low luminance conversion mode and the high luminance conversion mode by changing the amplitude of a pixel signal has been explained. However, even in an arrangement in which the conversion mode is switched by changing the slope of a ramp signal, as described in Japanese Patent Laid-Open No. 2010-45789, it is possible to correct the input/output characteristics of A/D conversion by measuring and obtaining correction values, as exemplified in this embodiment.

Although a case in which the final output value of digital data has N=14 bits has been explained in the above-described embodiments, the present invention is not limited to them. A preferred number of bits may be used according to a system. With respect to the bit width of a counter and a reference voltage, a preferred number of bits and a preferred voltage which are obtained by considering the A/D conversion speed and a quantization error may be used.

In the above-described embodiments, the bit extension unit performs bit extension by adding "0" to the upper or lower side. However, a bit extension method is not limited to this. Bits to be added to the lower side may include not only "0" but also "1". Alternatively, a circuit for generating random data may be arranged in the bit extension unit, and random data may be added to the lower side. Although the bit extension unit is configured to add bits to the upper or lower side, it may be formed by a multiplier. Assume, for example, that the threshold Vm is set to ⅓ of the full-scale amplitude. In this case, if the value of a pixel signal is equal to or larger than the threshold Vm, an amplitude control unit can set the amplitude to ⅓, and the multiplier can be arranged in the bit extension unit to multiply the amplitude by 3.

Other Embodiments

Embodiments of the present invention can also be realized by a computer of a system or apparatus that reads out and executes computer executable instructions recorded on a storage medium (e.g., non-transitory computer-readable storage medium) to perform the functions of one or more of the above-described embodiment(s) of the present invention, and by a method performed by the computer of the system or apparatus by, for example, reading out and executing the computer executable instructions from the storage medium to perform the functions of one or more of the above-described embodiment(s). The computer may comprise one or more of a central processing unit (CPU), micro processing unit (MPU), or other circuitry, and may include a network of separate computers or separate computer processors. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-098892, filed May 8, 2013, which is hereby incorporated by reference herein in its entirety.

What is claimed is:

1. An image pickup apparatus comprising:
   a pixel which converts arm optical signal into an electrical signal,
   a comparator which compares a pixel signal from the pixel with a predetermined threshold voltage,
   an A/D convertor which coverts, based on a result of comparing by the comparator, the pixel signal into digital data in a low A/D conversion mode when an amplitude of the pixel signal is lower than the predetermined threshold voltage and in a high luminance A/D conversation mode when an amplitude of the pixel signal is equal to or greater than the determined threshold voltage, and
   a processor which corrects an offset and a gain which are obtained by an A/D conversion by the A/D converter and included in output data of the A/D converter,
   wherein the processor corrects the offset and the gain included in the output data using an offset correction value and a gain correction value for low luminance mode when the A/D converter converts a pixel signal in the low luminance mode and using an offset correction value and a gain, correction value for high luminance mode when the A/D converter converts a pixel signal in the high luminance mode.

2. The apparatus according to claim 1, wherein a plurality of pixels are arranged in a row direction and a column direction, and the A/D convertor is arranged for each column.

3. The apparatus according to claim 1, wherein each of the offset correction value and the gain correction value is different for each column of the pixels.

4. The apparatus according to claim 1, wherein each of the offset correction value and the gain correction value is common for each column of the pixels.

5. The apparatus according to claim 1, further comprising a bit adder which extends the number of bits of the output data of the A/D convertor to a predetermined number of bits by adding a bit to one of an upper side and a lower side of the output data of the A/D convertor.

6. The apparatus according to claim 1, wherein the processor corrects the offset and the gain using the offset correction value and the gain correction value based on a result of comparing an A/D-converted pixel signal with a first reference value.

7. The apparatus according to claim 6, wherein the A/D convertor outputs a pixel signal so that the A/D-converted pixel signal becomes smaller than the first reference value a case where a voltage of the pixel signal is lower than the predetermined threshold voltage and the A/D-converted pixel signal becomes a value exceeding the first reference value in a case where the voltage of the pixel signal is not lower than the predetermined threshold voltage.

8. The apparatus according to claim 1, wherein the A/D convertor outputs information about the conversion mode together with digital data of the pixel signal.

9. The apparatus according to claim 8, wherein the A/D convertor replaces a least significant bit of digital data of the pixel signal by the information about the conversion mode, and outputs a resultant signal in a case where the digital data of the pixel signal falls within a range from a second reference value (inclusive) smaller than the first reference value to a third reference value (exclusive) larger than the first reference value.

10. The apparatus according to claim 8, wherein the processor changes the offset correction value and the gain correction value based on the information about the conversion mode.

11. The apparatus according to claim 1, wherein each of the offset correction value and the gain correction value is determined based on a plurality of input/output characteristics points of the A/D convertor.

12. The apparatus according to claim 1, wherein each of the offset correction value and the gain correction value is set in advance in the image pickup apparatus.

13. The apparatus according to claim 1, wherein each of the offset correction value and the gain correction value is determined according to an operation at the time of image pickup.

14. The apparatus according to claim 1, wherein the A/D convertor further includes an amplitude control unit which controls an amplitude of the pixel signal based on the result of comparing, and the A/D converter converts a signal from the amplitude control unit into the digital data.

* * * * *